(12) United States Patent
Digennaro

(10) Patent No.: US 11,380,850 B2
(45) Date of Patent: Jul. 5, 2022

(54) ORGANIC ELECTROLUMINESCENT DEVICES COMPRISING HOST COMPOUNDS

(71) Applicant: CYNORA GMBH, Bruchsal (DE)

(72) Inventor: Angela Digennaro, Heidelberg (DE)

(73) Assignee: CYNORA GMBH, Bruchsal (DE)

(*) Notice: Subject to any disclaimer, the term of this patent is extended or adjusted under 35 U.S.C. 154(b) by 495 days.

(21) Appl. No.: 16/346,593

(22) PCT Filed: Nov. 2, 2017

(86) PCT No.: PCT/EP2017/078041
§ 371 (c)(1),
(2) Date: May 1, 2019

(87) PCT Pub. No.: WO2018/083169
PCT Pub. Date: May 11, 2018

(65) Prior Publication Data
US 2019/0259958 A1    Aug. 22, 2019

(30) Foreign Application Priority Data
Nov. 4, 2016    (DE) .......................... 102016221628.7

(51) Int. Cl.
| H01L 51/00 | (2006.01) |
| C09K 11/06 | (2006.01) |
| H01L 51/50 | (2006.01) |

(52) U.S. Cl.
CPC .......... *H01L 51/0072* (2013.01); *C09K 11/06* (2013.01); *H01L 51/0067* (2013.01); *H01L 51/0073* (2013.01); *H01L 51/0074* (2013.01); *H01L 51/50* (2013.01); *H01L 51/5004* (2013.01); *H01L 51/5012* (2013.01); *H01L 2251/5384* (2013.01); *H01L 2251/552* (2013.01)

(58) Field of Classification Search
CPC ............. H01L 51/0072; H01L 51/0067; H01L 51/0073; H01L 51/0074; H01L 51/50; H01L 51/5004; H01L 51/5012; H01L 2251/5384; H01L 2251/552; H01L 51/5024; C09K 11/06
USPC ...................................................... 428/690
See application file for complete search history.

(56) References Cited

U.S. PATENT DOCUMENTS

| 10,319,917 B2* | 6/2019 | Watanabe ........... H01L 51/0058 |
| 10,476,008 B2* | 11/2019 | Kim ..................... C07D 209/86 |
| 10,622,565 B2* | 4/2020 | Parham ............... H01L 51/0056 |
| 2007/0141387 A1 | 6/2007 | Nakano et al. |
| 2012/0091887 A1 | 4/2012 | Osaka et al. |
| 2013/0341602 A1* | 12/2013 | Hikime ............... H01L 51/0074 |
| | | 257/40 |

| 2014/0231772 A1 | 8/2014 | Shiomi et al. |
| 2015/0104636 A1 | 4/2015 | Takemura |
| 2015/0255731 A1 | 9/2015 | Lee |
| 2017/0186965 A1 | 6/2017 | Parham et al. |

FOREIGN PATENT DOCUMENTS

| CN | 105294663 A | 2/2016 |
| EP | 1962354 A1 | 8/2008 |
| EP | 2123733 A2 | 11/2009 |
| EP | 2671935 A1 | 12/2013 |
| EP | 2688120 A1 | 1/2014 |
| JP | 2002305084 A | 10/2002 |
| JP | 2007042875 A | 2/2007 |
| JP | 2013060411 A | 4/2013 |
| JP | 2013243266 A | 12/2013 |
| JP | 2016149520 A | 8/2016 |
| JP | 2017514878 A | 6/2017 |
| KR | 20120072784 A | 7/2012 |
| WO | 2007069569 A1 | 6/2007 |

(Continued)

OTHER PUBLICATIONS

CAS reg. 2226193-10-6, May 31, 2018. (Year: 2018).*
International Preliminary Report on Patentability in International Application No. PCT/EP2017/078041, dated May 7, 2019.

* cited by examiner

*Primary Examiner* — Douglas J McGinty
(74) *Attorney, Agent, or Firm* — J.A. Lindeman & Co. PLLC

(57) ABSTRACT

The present invention relates to an organic electroluminescent device comprising a light-emitting layer B containing at least one host compound H of formula (I) wherein not more than two of the residues $A_1$, $A_2$, $A_3$ and $A_4$ are each N, X is O or S, and X' is $NR^e$, O or S. Further, the present invention refers to a method for generating light of a desired wavelength range by means of an organic electroluminescent device according to the present invention to which an electrical current is applied.

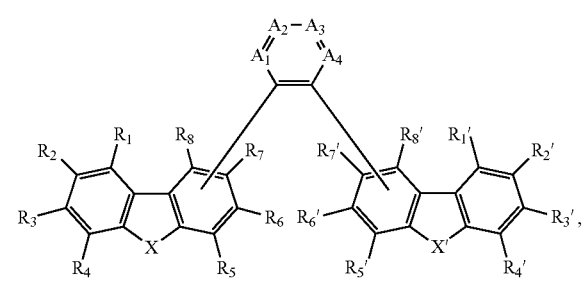

(I)

16 Claims, 1 Drawing Sheet

(56) References Cited

FOREIGN PATENT DOCUMENTS

| | | |
|---|---|---|
| WO | 2012124622 A1 | 9/2012 |
| WO | 2013069242 A1 | 5/2013 |
| WO | 2015169412 A1 | 11/2015 |
| WO | 2016/010402 A1 | 1/2016 |

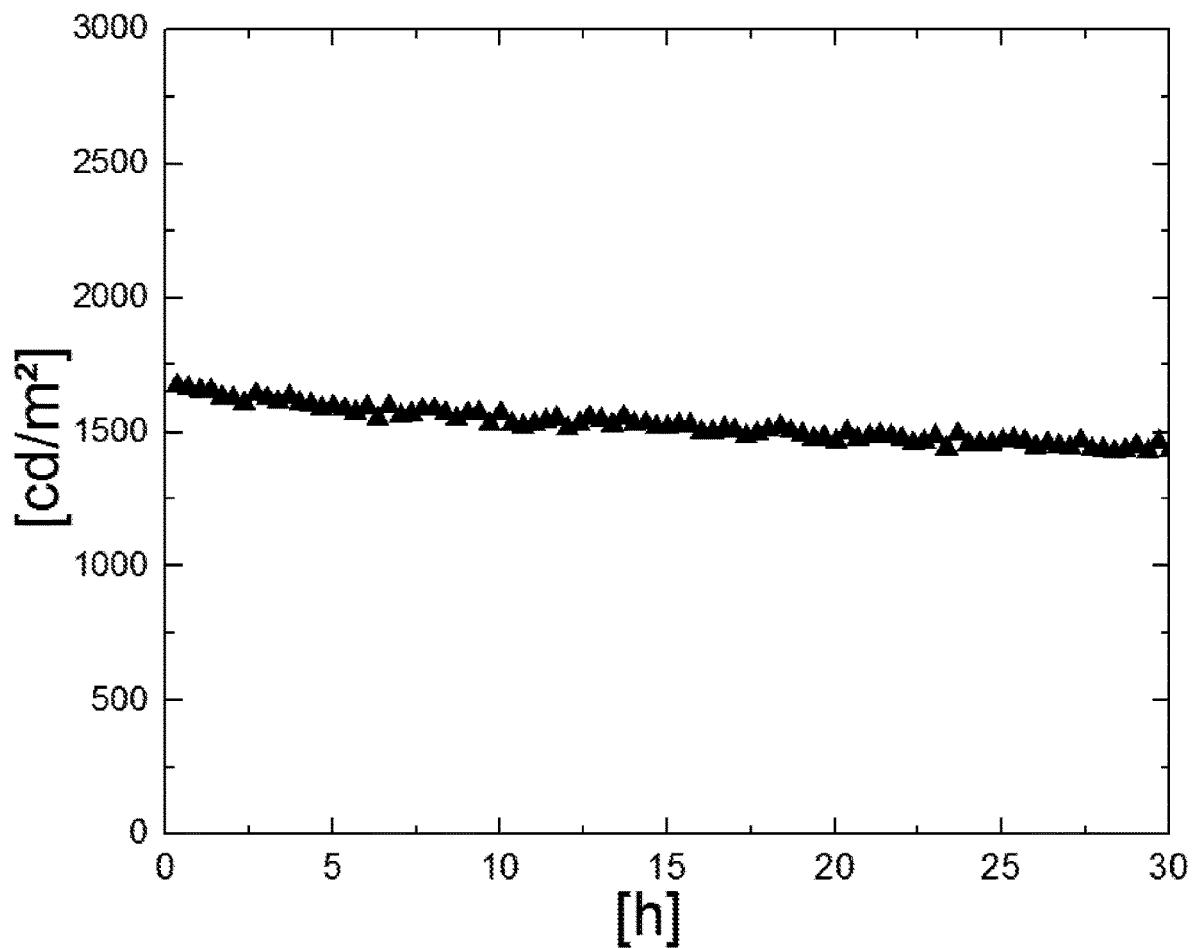

ORGANIC ELECTROLUMINESCENT DEVICES COMPRISING HOST COMPOUNDS

The present invention relates to an organic electroluminescent device comprising a light-emitting layer B containing at least one host compound H of formula (I)

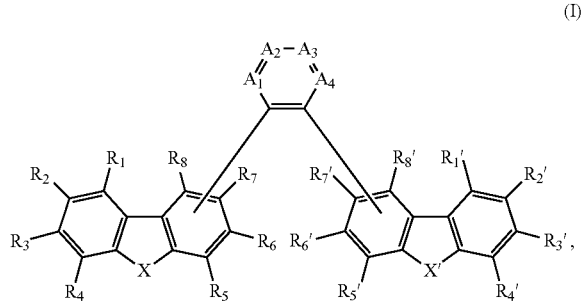

wherein not more than two of the residues $A_1$, $A_2$, $A_3$ and $A_4$ are each N, X is O or S, and X' is $NR^e$, O or S, preferably wherein all of the residues the residues $A_1$, $A_2$, $A_3$ and $A_4$ are each an optionally substituted carbon atom. Further, the present invention refers to a method for generating light of a desired wavelength range by means of an organic electroluminescent device according to the present invention to which an electrical current is applied.

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as, e.g., screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Excitons of high energy are then generated by recombination of the holes and the electrons. The decay of such excited states (e.g., singlet states such as S1 and/or triplet states such as T1) to the ground state (S0) desirably leads to light emission. In order to enable efficient energy transport and emission, an organic electroluminescent device comprises one or more host compounds and one or more emitter compounds as dopants.

Challenges when generating organic electroluminescent devices are the improvement of the illumination level of the devices (i.e., brightness per current), obtaining a desired light spectrum and achieving suitable lifespans.

In order to improve the illumination level achieved by a device per introduced electric energy, often host compounds are used which can transfer energy to the emitter compounds. In the ideal case of such host-emitter systems, the vast majority excitons are transferred via energy and/or charge transfer from the host compounds to the excited singlet S1 or triplet T1 energy levels of the emitter compounds. Often host compounds further help to spatially separate emitter compounds from another and thereby prevent (self-)quenching. In addition, host compounds may help to improve morphology and/or thermal stability of the emitter layer. A large variety of host compounds is known in the art.

However, many of the host components known in the art bear reactive functional groups that impair the usability, storability and lifespan of the host compounds. Exemplarily, many hosts are particularly sensitive to oxidation. Further, many of the host compounds known in the art require comparably complicated synthesis steps and are thus comparably expensive. Further, it is desired to obtain host compounds that are ambi-polar and/or n-type hosts or ambi-polar and/or electron rich p-type hosts, suitable to provide charge carrier mobility allowing for particularly low driving voltage and/or high brightness.

US-A 2015/0255731 and KR-A 2012-0072784 describe host compounds bearing a rather complex tricyclic core structure. WO 2016/010402 describes bis-carbazole derivatives in which the nitrogen atoms of the carbazoles are both linked to aryls. These host compounds are rather stable and effective. However, these compounds bear rather complex structures requiring complex synthesis. Further, their characteristics and ability for energy transfer are still improvable.

CN-A 105294663 teaches pyridine-containing compounds for use in OLEDs. US-A 2015/0104636 and US-A 2014/0231772 both teach electroluminescent devices and compounds for use therein, wherein such compounds are taught to bear heterocycles which are each substituted by a number of substituents, in particular are each substituted by two (hetero)aromatic residues.

In the view of the prior art, there is still a need to provide host compounds that are easily obtainable and chemically and thermally stable enabling long lifespans. It is desired that these host compounds bear high triplet energy levels leading to low triplet quenching, and are able to efficiently transfer energy to emitter compounds in the shorter wavelength (deep blue, sky blue or green) range.

Surprisingly, it has been found that the host compound H of the present invention composed of a (hetero)aryl bridging two optionally substituted carbazole, dibenzofurane or dibenzothiophene residues comprising as heteroatoms X=O or S and X'=$NR^e$, O or S, respectively, wherein $R^e$ is not hydrogen, leads to particularly beneficial properties. The compounds are chemically and thermally stable and allow for long lifespans. The host compound H is chemically well obtainable. The triplet energy T1(H) of the host compound H is rather high as well as the band gap which leads to low triplet quenching. The host compound H enables low driving voltage and high brightness in the visible range. As the polarity of the host compounds of the present invention is comparably low, there is a comparably low red-shift of the emission and thereby allows for easier realization of blue emission.

In general, an organic electroluminescent device is taught that comprises a light-emitting layer B containing at least one host compound H of formula (I)

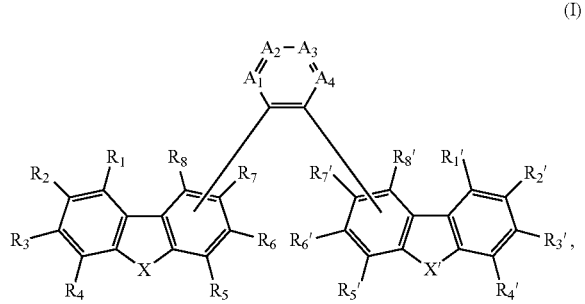
(I)

wherein not more than two of the residues $A_1$, $A_2$, $A_3$ and $A_4$ are each N, X is O or S, and X' is $NR^e$, O or S.

More preferably, the present invention relates to an organic electroluminescent device that comprises a light-emitting layer B containing at least one host compound H of formula (I), wherein:

each of $A_1$, $A_2$, $A_3$ and $A_4$ is independently from another selected from the group consisting of CH, $CR^a$, and N, wherein not more than two of the residues $A_1$, $A_2$, $A_3$ and $A_4$ are N;

one of $R_5$, $R_6$, $R_7$ and $R_8$ and one of $R'_5$, $R'_6$, $R'_7$ and $R'_8$ are each a binding site to the optionally substituted $C_4$-$C_6$-(hetero)arylene residue comprising the residues $A_1$, $A_2$, $A_3$ and $A_4$, and each of the remaining residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ is, independently from another, selected from the group consisting of hydrogen, $C_1$-$C_{20}$-alkyl, $C_6$-$C_{18}$-aryl, $C_3$-$C_{17}$-heteroaryl, $C_7$-$C_{19}$-alkaryl, and —$SiR^bR^cR^d$, wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;

X is O or S;
X' is $NR^e$, O or S; and
each of $R^a$, $R^b$, $R^c$, $R^d$ and $R^e$ is selected from the group consisting of unsubstituted or substituted $C_6$-$C_{18}$-aryl, $C_1$-$C_{20}$-alkyl, $C_1$-$C_{20}$-heteroalkyl and $C_3$-$C_{17}$-heteroaryl.

The present invention refers to an organic electroluminescent device comprising a light-emitting layer B containing at least one host compound H of formula (I):

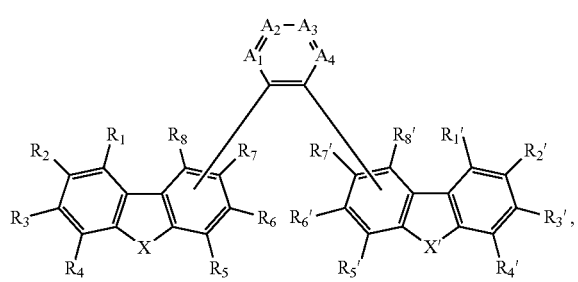
(I)

wherein:
each of $A_1$, $A_2$, $A_3$ and $A_4$ is independently from another selected from the group consisting of CH, $CR^a$, and N, wherein not more than two of the residues $A_1$, $A_2$, $A_3$ and $A_4$ are N;

one of $R_5$, $R_6$, $R_7$ and $R_8$ and one of $R'_5$, $R'_6$, $R'_7$ and $R'_8$ are each a binding site to the optionally substituted $C_4$-$C_6$-(hetero)arylene residue comprising the residues $A_1$, $A_2$, $A_3$ and $A_4$, and each of the remaining residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ is, independently from another, selected from the group consisting of hydrogen, $C_1$-$C_{20}$-alkyl, $C_6$-$C_{18}$-aryl, $C_3$-$C_{17}$-heteroaryl, $C_7$-$C_{19}$-alkaryl, and —$SiR^bR^cR^d$, wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;

X is O or S;
X' is $NR^e$, O or S; and
each of $R^a$, $R^b$, $R^c$, $R^d$ and $R^e$ is selected from the group consisting of unsubstituted or substituted $C_6$-$C_{18}$-aryl, $C_1$-$C_{20}$-alkyl, $C_1$-$C_{20}$-heteroalkyl and $C_3$-$C_{17}$-heteroaryl.

An aspect of the present invention refers to an organic electroluminescent device comprising a light-emitting layer B containing at least one host compound H of formula (I):

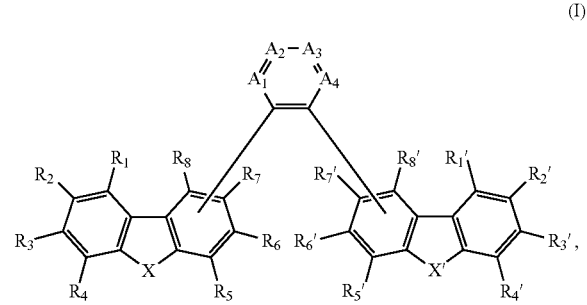
(I)

wherein:
each of $A_1$, $A_2$, $A_3$ and $A_4$ is independently from another selected from the group consisting of CH and $CR^a$;
one of $R_5$, $R_6$, $R_7$ and $R_8$ and one of $R'_5$, $R'_6$, $R'_7$ and $R'_8$ are each a binding site to the optionally substituted $C_4$-$C_6$-(hetero)arylene residue comprising the residues $A_1$, $A_2$, $A_3$ and $A_4$, and each of the remaining residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ is, independently from another, selected from the group consisting of hydrogen, $C_1$-$C_{20}$-alkyl, $C_6$-$C_{18}$-aryl, $C_3$-$C_{17}$-heteroaryl, $C_7$-$C_{19}$-alkaryl, and —$SiR^bR^cR^d$, wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl, wherein at least 13 of $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen;
X is O or S;
X' is $NR^e$, O or S; and
each of $R^a$, $R^b$, $R^c$, $R^d$ and $R^e$ is selected from the group consisting of unsubstituted or substituted $C_6$-$C_{18}$-aryl, $C_1$-$C_{20}$-alkyl, $C_1$-$C_{20}$-heteroalkyl and $C_3$-$C_{17}$-heteroaryl.

Typically, the host compound H of formula (I) is free of potentially unstable functional groups such as sulfone, phosphineoxides, and F.

As used herein, the terms organic electroluminescent device and opto-electronic light-emitting devices may be understood in the broadest sense as any device comprising at least one light-emitting layer B containing on one or more organic host compounds and one or more organic emitter compounds. The light-emitting layer B may be mainly composed of both inorganic compounds and organic components. Preferably, the light-emitting layer B is mainly or even completely composed of organic components (including at least one host compound H of the present invention and typically at least one emitter compound E).

The term "layer" as used in the context of the present invention preferably is a body that bears an extensively planar geometry. The light-emitting layer B preferably bears a thickness of not more than 1 mm, more preferably not more than 0.1 mm, even more preferably not more than 10 µm, even more preferably not more than 1 µm, in particular not more than 0.1 µm.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing").

This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., dropcasting) and rolling methods, and printing methods (e.g., inkjet printing, gravure printing, blade coating). This may optionally be carried out in an inert atmosphere (e.g., in a nitrogen atmosphere).

Alternatively, the layers in the context of the present invention, including the light-emitting layer B, may be prepared by any other method known in the art, including but not limited to vacuum processing methods well-known to those skilled in the art such as, e.g., thermal (co-) evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound H and, typically, at least one emitter compound E and optionally one or more other host compounds D) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy)ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring. Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the OLED may be a phosphorescent organic light-emitting diode (PHOLED). Optionally, the OLED may include hyperfluorescence. Optionally, the organic electroluminescent device as a whole may be intransparent, semi-transparent or (essentially) transparent.

The optionally substituted $C_4$-$C_6$-(hetero)arylene residue comprising the residues $A_1$, $A_2$, $A_3$ and $A_4$ may be selected from the group consisting of phenyl, pyridine, pyrimidine and pyrazine, which is each at least ortho-substituted by the optionally substituted carbazole, dibenzofurane or dibenzothiophene residues which bear the heteroatoms X and X' respectively, and may optionally be further substituted.

Preferably, said $C_4$-$C_6$-(hetero)arylene residue is not further substituted. Preferably, in the host compound H of formula (I), not more than one of the residues $A_1$, $A_2$, $A_3$ and $A_4$ is N. Preferably, not more than two of the residues $A_1$, $A_2$, $A_3$ and $A_4$ are $CR^a$. More preferably, not more than one of the residues $A_1$, $A_2$, $A_3$ and $A_4$ is N and not more than two of the residues $A_1$, $A_2$, $A_3$ and $A_4$ are $CR^a$.

The ortho-substitution may lead to steric hindrance which may lead to improved decoupling resulting in a comparably high triplet energy level T1(H) and a relatively high band gap.

According to the present invention, $A_1$, $A_2$, $A_3$ and $A_4$ are preferably each CH or $CR^a$. Preferably, at least two of $A_1$, $A_2$, $A_3$ and $A_4$ are herein each CH. More preferably, at least three of $A_1$, $A_2$, $A_3$ and $A_4$ are herein each CH.

Accordingly, examples of preferred embodiments are:
$A_1$=CH, $A_2$=CH, $A_3$=CH, and $A_4$=CH;
$A_1$=$CR^a$, $A_2$=CH, $A_3$=CH, and $A_4$=CH;
$A_1$=CH, $A_2$=$CR^a$, $A_3$=CH, and $A_4$=CH;
$A_1$=CH, $A_2$=CH, $A_3$=$CR^a$, and $A_4$=CH;
$A_1$=CH, $A_2$=CH, $A_3$=CH, and $A_4$=$CR^a$;
$A_1$=N, $A_2$=CH, $A_3$=CH, and $A_4$=CH;
$A_1$=CH, $A_2$=N, $A_3$=CH, and $A_4$=CH;
$A_1$=CH, $A_2$=CH, $A_3$=N, and $A_4$=CH;
$A_1$=CH, $A_2$=CH, $A_3$=CH, and $A_4$=N;
$A_1$=$CR^a$, $A_2$=CH, $A_3$=CH, and $A_4$=CH;
$A_1$=$CR^a$, $A_2$=N, $A_3$=CH, and $A_4$=CH;
$A_1$=$CR^a$, $A_2$=CH, $A_3$=N, and $A_4$=CH;
$A_1$=$CR^a$, $A_2$=CH, $A_3$=CH, and $A_4$=N;
$A_1$=$CR^a$, $A_2$=CH, $A_3$=N, and $A_4$=N;
$A_1$=N, $A_2$=$CR^a$, $A_3$=CH, and $A_4$=CH;
$A_1$=CH, $A_2$=$CR^a$, $A_3$=N, and $A_4$=CH;
$A_1$=CH, $A_2$=$CR^a$, $A_3$=CH, and $A_4$ N;
$A_1$=N, $A_2$=CH, $A_3$=$CR^a$, and $A_4$=CH;
$A_1$=CH, $A_2$=N, $A_3$=$CR^a$, and $A_4$=CH;
$A_1$=CH, $A_2$=CH, $A_3$=$CR^a$, and $A_4$=N;
$A_1$=N, $A_2$=CH, $A_3$=CH, and $A_4$=$CR^a$;
$A_1$=CH, $A_2$=N, $A_3$=CH, and $A_4$=$CR^a$;
$A_1$=CH, $A_2$=CH, $A_3$=N, and $A_4$=$CR^a$;
$A_1$=$CR^a$, $A_2$=$CR^a$, $A_3$=CH, and $A_4$=CH;
$A_1$=$CR^a$, $A_2$=CH, $A_3$=$CR^a$, and $A_4$=CH;
$A_1$=$CR^a$, $A_2$=CH, $A_3$=CH, and $A_4$=$CR^a$;
$A_1$=CH, $A_2$=$CR^a$, $A_3$=$CR^a$, and $A_4$=CH;
$A_1$=CH, $A_2$=$CR^a$, $A_3$=CH, and $A_4$=$CR^a$; and
$A_1$=CH, $A_2$=CH, $A_3$=$CR^a$, and $A_4$=$CR^a$.

In a particularly preferred embodiment, all of $A_1$, $A_2$, $A_3$ and $A_4$ are each CH.

Preferably, all or the majority of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are hydrogen, and the remaining of said residues are selected from the group consisting of $C_1$-$C_{20}$-alkyl, $C_6$-$C_{18}$-aryl, $C_3$-$C_{17}$-heteroaryl and —$SiR^bR^cR^d$.

Preferably, at least twelve of $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen. Accordingly, as two of the residues $R_5$, $R_6$, $R_7$, $R_8$, $R'_5$, $R'_6$, $R'_7$ and $R'_8$ represent the binding site to the to the optionally substituted $C_4$-$C_6$-(hetero)arylene residue comprising the residues $A_1$, $A_2$, $A_3$ and $A_4$, then, not more than two residues may optionally each be a residue other than hydrogen, i.e., a substituent. According to the present invention, at least 13 of $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are preferably each hydrogen. Accordingly, not more than one residue may optionally be a residue other than hydrogen, i.e., a substituent.

Optionally, such substituent other than hydrogen or any of $A_1$, $A_2$, $A_3$, $A_4$, $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and/or $R'_8$ and/or also X and/or X' can be used to adjust the chemical and/or physical properties of the host compound H such as, e.g., the glass transition temperature of the host compound H or a composition comprising such.

Alternatively it is disclosed that at least six of $R_1$, $R_2$, $R_3$, $R_4$, $R_5$, $R_6$, $R_7$ and $R_8$, and at least six of $R'_1$, $R'_2$, $R'_3$, $R'_4$, $R'_5$, $R'_6$, $R'_7$ and $R'_8$ may be each hydrogen.

Accordingly, as one of the residues $R_5$, $R_6$, $R_7$, $R_8$, as well as one of the residues $R'_5$, $R'_6$, $R'_7$ and $R'_8$ each represent the binding site to the to the optionally substituted $C_4$-$C_6$-(hetero)arylene residue comprising the residues $A_1$, $A_2$, $A_3$ and $A_4$, then, not more than one of the residues $R_5$, $R_6$, $R_7$, $R_8$, as well as not more than one of the residues $R'_5$, $R'_6$, $R'_7$ and $R'_8$ may optionally each be a residue other than hydrogen, i.e., a substituent.

Exemplarily, the following preferred embodiments are provided, wherein in the host compound H according to formula (I), the residues are defined as follows:
$R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen;
$R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen and $R_1$ is a substituent other than hydrogen;
$R_1$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen and $R_2$ is a substituent other than hydrogen;
$R_1$, $R_2$, $R_4$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen and $R_3$ is a substituent other than hydrogen;
$R_1$, $R_2$, $R_3$, $R_5$, $R_6$, $R_7$, $R_8$, $R'_1$, $R'_2$, $R'_3$, $R'_4$, $R'_5$, $R'_6$, $R'_7$ and $R'_8$ are each hydrogen and $R_4$ is a substituent other than hydrogen;
$R_1$, $R_2$, $R_3$, $R_4$, $R_6$, $R_7$, $R_8$, $R'_1$, $R'_2$, $R'_3$, $R'_4$, $R'_5$, $R'_6$, $R'_7$ and $R'_8$ are each hydrogen and $R_5$, is a substituent other than hydrogen;
$R_1$, $R_2$, $R_3$, $R_4$, $R_5$, $R_7$, $R_8$, $R'_1$, $R'_2$, $R'_3$, $R'_4$, $R'_5$, $R'_6$, $R'_7$ and $R'_8$ are each hydrogen and $R_6$ is a substituent other than hydrogen;
$R_1$, $R_2$, $R_3$, $R_4$, $R_5$, $R_6$, $R_8$, $R'_1$, $R'_2$, $R'_3$, $R'_4$, $R'_5$, $R'_6$, $R'_7$ and $R'_8$ are each hydrogen and $R_7$, is a substituent other than hydrogen;
$R_1$, $R_2$, $R_3$, $R_4$, $R_5$, $R_6$, $R_8$, $R'_1$, $R'_2$, $R'_3$, $R'_4$, $R'_5$, $R'_6$, $R'_7$ and $R'_8$ are each hydrogen and $R_7$ is a substituent other than hydrogen;
$R_1$, $R_2$, $R_3$, $R_4$, $R_5$, $R_6$, $R_7$, $R'_1$, $R'_2$, $R'_3$, $R'_4$, $R'_5$, $R'_6$, $R'_7$ and $R'_8$ are each hydrogen and $R_8$ is a substituent other than hydrogen;
$R_1$, $R_2$, $R_3$, $R_4$, $R_5$, $R_6$, $R_7$, $R_8$, $R'_2$, $R'_3$, $R'_4$, $R'_5$, $R'_6$, $R'_7$ and $R'_8$ are each hydrogen and $R'_1$ is a substituent other than hydrogen;
$R_1$, $R_2$, $R_3$, $R_4$, $R_5$, $R_6$, $R_7$, $R_8$, $R'_1$, $R'_3$, $R'_4$, $R'_5$, $R'_6$, $R'_7$ and $R'_8$ are each hydrogen and $R'_2$ is a substituent other than hydrogen;
$R_1$, $R_2$, $R_3$, $R_4$, $R_5$, $R_6$, $R_7$, $R_8$, $R'_1$, $R'_2$, $R'_4$, $R'_5$, $R'_6$, $R'_7$ and $R'_8$ are each hydrogen and $R'_3$ is a substituent other than hydrogen;
$R_1$, $R_2$, $R_3$, $R_4$, $R_5$, $R_6$, $R_7$, $R_8$, $R'_1$, $R'_2$, $R'_3$, $R'_5$, $R'_6$, $R'_7$ and $R'_8$ are each hydrogen and $R'_4$ is a substituent other than hydrogen;
$R_1$, $R_2$, $R_3$, $R_4$, $R_5$, $R_6$, $R_7$, $R_8$, $R'_1$, $R'_2$, $R'_3$, $R'_4$, $R'_6$, $R'_7$ and $R'_8$ are each hydrogen and $R'_5$ is a substituent other than hydrogen;
$R_1$, $R_2$, $R_3$, $R_4$, $R_5$, $R_6$, $R_7$, $R_8$, $R'_1$, $R'_2$, $R'_3$, $R'_4$, $R'_5$, $R'_7$ and $R'_8$ are each hydrogen and $R'_6$ is a substituent other than hydrogen;

$R_1$, $R_2$, $R_3$, $R_4$, $R_5$, $R_6$, $R_7$, $R_8$, $R'_1$, $R'_2$, $R'_3$, $R'_4$, $R'_5$, $R'_6$ and $R'_8$ are each hydrogen and $R'_7$ is a substituent other than hydrogen;

$R_1$, $R_2$, $R_3$, $R_4$, $R_5$, $R_6$, $R_7$, $R_8$, $R'$, $R'_2$, $R'_3$, $R'_4$, $R'_5$, $R'_6$ and $R'_7$ are each hydrogen and $R'_8$ is a substituent other than hydrogen;

$R_2$, $R_3$, $R_4$, $R_5$, $R_6$, $R_7$, $R_8$, $R'_2$, $R'_3$, $R'_4$, $R'_5$, $R'_6$, $R'_7$ and $R'_8$ are each hydrogen and $R_1$ and $R'_1$ are each a substituent other than hydrogen;

$R_1$, $R_3$, $R_4$, $R_5$, $R_6$, $R_7$, $R_8$, $R'_1$, $R'_3$, $R'_4$, $R'_5$, $R'_6$, $R'_7$ and $R'_8$ are each hydrogen and $R_2$ and $R'_2$ are each a substituent other than hydrogen;

$R_1$, $R_2$, $R_4$, $R_5$, $R_6$, $R_7$, $R_8$, $R'_1$, $R'_2$, $R'_4$, $R'_5$, $R'_6$, $R'_7$ and $R'_8$ are each hydrogen and $R_3$ and $R'_3$ are each a substituent other than hydrogen;

$R_1$, $R_2$, $R_3$, $R_5$, $R_6$, $R_7$, $R_8$, $R'_1$, $R'_2$, $R'_3$, $R'_5$, $R'_6$, $R'_7$ and $R'_8$ are each hydrogen and $R_4$ and $R'_4$ are each a substituent other than hydrogen;

$R_1$, $R_2$, $R_3$, $R_4$, $R_6$, $R_7$, $R_8$, $R'_1$, $R'_2$, $R'_3$, $R'_4$, $R'_6$, $R'_7$ and $R'_8$ are each hydrogen and $R_5$ and $R'_5$ are each a substituent other than hydrogen;

$R_1$, $R_2$, $R_3$, $R_4$, $R_5$, $R_7$, $R_8$, $R'_1$, $R'_2$, $R'_3$, $R'_4$, $R'_5$, $R'_6$ and $R'_8$ are each hydrogen and $R_6$ and $R'_6$ are each a substituent other than hydrogen;

$R_1$, $R_2$, $R_3$, $R_4$, $R_5$, $R_6$, $R_8$, $R'_1$, $R'_2$, $R'_3$, $R'_4$, $R'_5$, $R'_6$ and $R'_8$ are each hydrogen and $R_7$ and $R'_7$ are each a substituent other than hydrogen; or $R_1$, $R_2$, $R_3$, $R_4$, $R_5$, $R_6$, $R_7$, $R'_1$, $R'_2$, $R'_3$, $R'_4$, $R'_5$, $R'_6$ and $R'_7$ are each hydrogen and $R_8$ and $R'_8$ are each a substituent other than hydrogen.

In a particularly preferred embodiment, all of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ are each hydrogen.

$A_1$, $A_2$, $A_3$ and $A_4$ may be each CH or $CR^a$ and not more than two of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ may be substituents other than hydrogen and the remaining residues may be all hydrogen.

Preferably, $A_1$, $A_2$, $A_3$ and $A_4$ are each CH or $CR^a$ and all of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ are hydrogen.

Preferably, at least two, more preferably at least three, of $A_1$, $A_2$, $A_3$ and $A_4$ are herein each CH and not more than one of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ are is a substituent other than hydrogen and the remaining residues are all hydrogen.

Preferably, at least two more preferably at least three, of $A_1$, $A_2$, $A_3$ and $A_4$ are herein each CH and all of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ are hydrogen.

In a particularly preferred embodiment, $A_1$, $A_2$, $A_3$ and $A_4$ are each CH and all of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ are each hydrogen.

As laid out above, in the host compound H of formula (I), X may be O or S, and X' may be $NR^e$, O or S.

Accordingly, the host compound H of formula (I) may have the following definitions of X and X':

X=O and X' =$NR^e$;

X=O and X' =O;

X=O and X' =S;

X=S and X' =$NR^e$;

X=S and X' =O; or

X=S and X' =S.

Preferably, X' is $NR^e$. Particularly preferably, in the host compound H of formula (I), X is O and X' is $NR^e$.

Herein, $R^e$ may be selected from the group consisting of unsubstituted or substituted $C_6$-$C_{18}$-aryl, $C_1$-$C_{20}$-alkyl, $C_1$-$C_{20}$-heteroalkyl and $C_3$-$C_{17}$-heteroaryl.

Preferably, $R^e$ is selected from the group consisting of unsubstituted or substituted $C_6$-$C_{18}$-aryl and $C_1$-$C_{10}$-alkyl, more preferably selected from the group consisting of unsubstituted or substituted residue selected from the group consisting of phenyl, pyridyl, methyl, ethyl, biphenyl, and terphenyl.

Accordingly, in a preferred embodiment, X' is $NR^e$ and $R^e$ is selected from the group consisting of an unsubstituted or substituted residue selected from the group consisting of phenyl, pyridyl, methyl, ethyl, biphenyl, and terphenyl.

Even more preferably, X' is $NR^e$ and $R^e$ is selected from the group consisting of an unsubstituted residue selected from the group consisting of phenyl, pyridyl, methyl, ethyl, biphenyl, and terphenyl. Particularly preferably, X' is $NR^e$ and $R^e$ is phenyl.

$A_1$, $A_2$, $A_3$ and $A_4$ may be each CH or $CR^a$, not more than two of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ may be substituents other than hydrogen and the remaining residues may be all hydrogen, and X' may be $NR^e$.

In a particularly preferred embodiment, $A_1$, $A_2$, $A_3$ and $A_4$ are each CH, all of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$ and $R'_8$ which are not the binding site to the optionally substituted $C_4$-$C_6$-(hetero)arylene residue comprising the residues $A_1$, $A_2$, $A_3$ and $A_4$ are each hydrogen and X' is $NR^e$.

As mentioned above, one of $R_5$, $R_6$, $R_7$ and $R_8$ and one of $R'_5$, $R'_6$, $R'_7$ and $R'_8$ are each binding sites to the optionally substituted $C_4$-$C_6$-(hetero)arylene residue comprising the residues $A_1$, $A_2$, $A_3$ and $A_4$. Herein, binding site can be any of $R_5$, $R_6$, $R_7$ and $R_8$ and any of $R'_5$, $R'_6$, $R'_7$ and $R'_8$.

Preferably, the binding sites of the host compound H of formula (I) are defined as follows, i.e., binding sites are: $R_5$ and $R'_5$; $R_6$ and $R'_6$; $R_7$ and $R'_7$; or $R_8$ and $R'_8$. Alternatively, the binding sites of the host compound H of formula (I) may be as follows: $R_5$ and $R'_6$; $R_5$ and $R'_7$; $R_5$ and $R'_8$; $R_6$ and $R'_5$; $R_6$ and $R'_7$; $R_6$ and $R'_8$; $R_7$ and $R'_5$; $R_7$ and $R'_6$; $R_7$ and $R'_8$; $R_8$ and $R'_5$; $R_8$ and $R'_6$; or $R_8$ and $R'_7$. Preferably, $R_7$ represents a binding site and/or $R'_7$ represents a binding site. In particular $R_7$ and $R'_7$ represent the binding sites to the optionally substituted $C_4$-$C_6$-(hetero)arylene residue comprising the residues $A_1$, $A_2$, $A_3$ and $A_4$.

In a preferred embodiment, the host compound H has a structure according to one of the following formulae (II)-(IV):

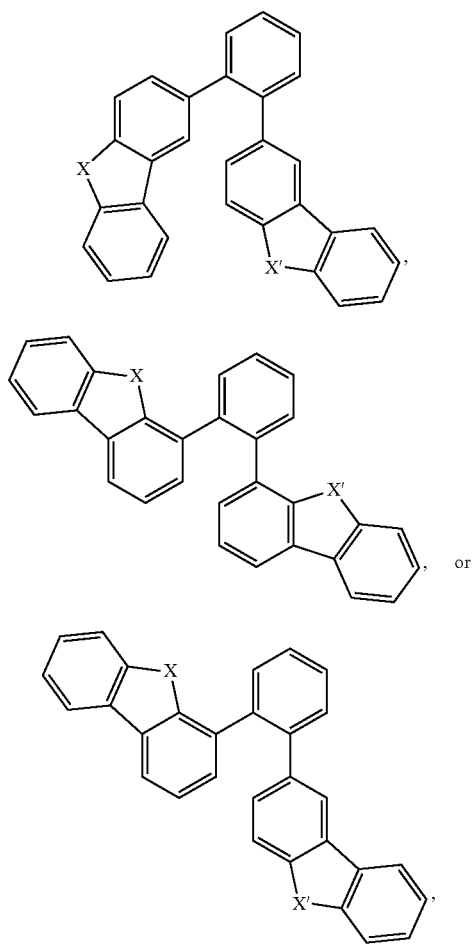

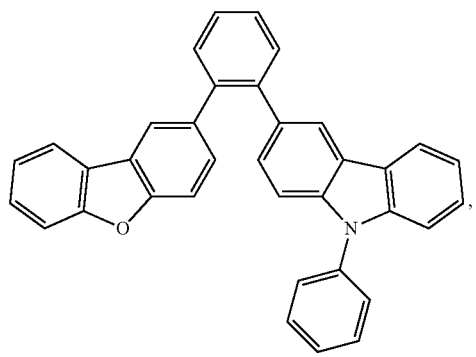

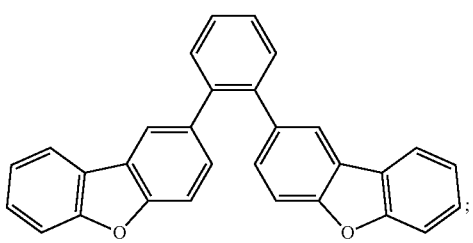

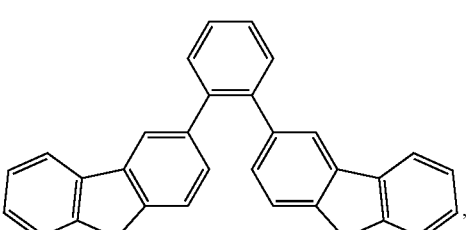

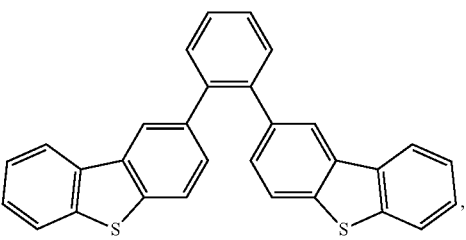

wherein X and X' are defined as lay out in the context of the present invention.

As laid out above, particularly preferably, in this context, X' is $NR^e$, in particular wherein $R^e$ is unsubstituted or substituted $C_6$-$C_{18}$-aryl and $C_1$-$C_{10}$-alkyl, such as phenyl.

In a preferred embodiment, the host compound H has a structure of the following formula (V):

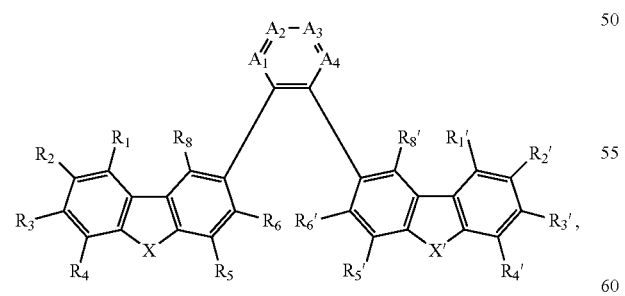

wherein the residues $A_1$, $A_2$, $A_3$, $A_4$, $R_1$, $R_2$, $R_3$, $R_4$, $R_5$, $R_6$, $R_8$, $R'_1$, $R'_2$, $R'_3$, $R'_4$, $R'_5$, $R'_6$, $R'_8$, X, and X' are defined as above.

In a particularly preferred embodiment, the host compound H has a structure according to one of the following formulae (VI)-(X):

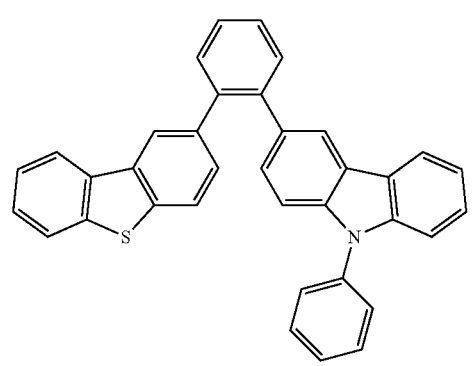

According to the most preferred embodiment, the host compound H has a structure according to formula (VI):

(VI)

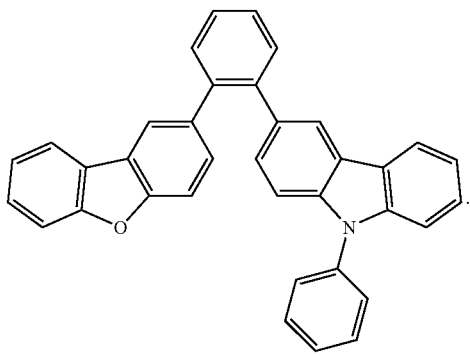

According to the present invention, the host compound H is comprised in a light-emitting layer B. This layer will typically further comprise at least one emitter compound E. Optionally, the light-emitting layer B may comprise further host compounds other than that of formula (I) and/or one or more solvents.

The components may be comprised in various amounts. Preferably, the light-emitting layer B comprises 5-99% by weight, preferably 30-94.9% by weight, in particular 40-89% by weight, of at least one host compound H according to the present invention.

Preferably, the light-emitting layer B further comprises 1-50% by weight, preferably 5-40% by weight, in particular 10-30% by weight, of at least one emitter compound E.

Optionally, the light-emitting layer B may comprise up to 94% by weight, preferably 0.1-65% by weight, in particular 1-50% by weight, of one or more further host compounds D ($D^1$, $D^2$, $D^3$, . . . ), i.e, at least one further host compound D ($D^1$), not according to formula (I).

Optionally, the light-emitting layer B may comprise up to 94% by weight, preferably not more than 65% by weight, more preferably not more than 50% by weight, more preferably not more than 20% by weight, of a solvent, in particular no solvent.

In a preferred embodiment, the light-emitting layer B comprises (or (essentially) consists of):
(i) 5-99% by weight, preferably 30-94.9% by weight, in particular 40-89% by weight, of at least one host compound H according to the present invention;
(ii) 1-50% by weight, preferably 5-40% by weight, in particular 10-30% by weight, of at least one emitter compound E; and optionally
(iii) 0-94% by weight, preferably 0.1-65% by weight, in particular 1-50% by weight, of at least one further host compound D not according to formula (I); and optionally
(iv) 0-94% by weight, preferably 0-65% by weight, in particular 0-50% by weight, of a solvent.

Accordingly, preferably, the light-emitting layer B comprises (or (essentially) consists of):
(i) 5-99% by weight of at least one host compound H according to the present invention;
(ii) 1-50% by weight of at least one emitter compound E; and optionally
(iii) 0-94% by weight of at least one further host compound D not according to formula (I); and optionally
(iv) 0-94% by weight of a solvent.

More preferably, the light-emitting layer B comprises (or (essentially) consists of):
(i) 30-94.9% by weight of at least one host compound H according to the present invention;
(ii) 5-40% by weight of at least one emitter compound E;
(iii) 0.1-65% by weight of at least one further host compound D not according to formula (I); and optionally
(iv) 0-65% by weight of a solvent.

Even more preferably, the light-emitting layer B comprises (or (essentially) consists of):
(i) 40-89% by weight of at least one host compound H according to the present invention;
(ii) 10-30% by weight of at least one emitter compound E;
(iii) 1-50% by weight of at least one further host compound D not according to formula (I); and optionally
(iv) 0-50% by weight of a solvent.

In order to improve the flow properties, in addition, one or more additives S may optionally be added. Exemplarily, such an additives may be selected from the group consisting of polyethyloxides (polyethylene glycols), polyethylene diamines, polyacrylates (e.g., poly(methyl methacrylate) (PMMA), polyacrylic acid and salts thereof (superabsorber)), substituted or unsubstituted polystyrenes (e.g., polyhydroxystyrene), polyvinylalcohols, Polyesters or polyurethanes, polyvinylcarbazoles, polytriarylamines, polythiophenes and poly(vinylidene phenylenes). Also a combination of two or more additives may be used.

In order to modify the emission spectrum and/or the absorption spectrum of the light-emitting layer B further, the light-emitting layer B may further comprise one or more dyes. Such dye may be any dye known in the art. The dye may optionally be a fluorescent and/or phosphorescent dye which is able to shift the emission spectrum and/or the absorption spectrum of the light-emitting layer B. Optionally, it may also provoke two-photon effects (i.e., the absorption of two photons of half the energy of the absorption maximum). Optionally, the light-emitting layer B may also comprise fluorescent polymers (e.g., superyellow (SY)), photoluminescent nanoparticles (e.g., of silicium), quantum dots, cadmium selenide and/or exciplexes, optionally diluted with one or more host components.

In particular when it is intended for a light-emitting electrochemical cell (LEC), the light-emitting layer may comprise an ionic fluid or a combination of two or more ionic liquids. Exemplarily, such ionic fluid may be such selected from the group consisting of: methylimidazolium hexafluorophosphates (e.g., 1-alkyl-3-methylimidazolium hexafluorophosphate such as 1-methyl-3-methylimidazolium hexafluorophosphat, 1-ethyl-3-methylimidazolium hexafluorophosphate, 1-propyl-3-methylimidazolium hexafluorophosphate, 1-butyl-3-methylimidazolium hexafluorophosphate, 1-benzyl-3-methylimidazolinium hexafluorophosphate), dimethylimidazolium hexafluorophosphates (e.g., 1-alkyl-2,3-dimethylimidazolium hexafluorophosphate such as 1-butyl-2,3-dimethylimidazolium hexafluorophosphate), 3-methylimidazolium hexafluorophosphates (e.g., 1-alkyl-methylimidazolium hexafluorophosphates such as 1-methyl-3-methylimidazolium hexafluorophosphate, 1-ethyl-3-methylimidazolium hexafluorophosphate, 1-propyl-3-methylimidazolium hexafluorophosphate, 1-butyl-3-methylimidazolium hexafluorophosphate, 1-pentyl-3-methylimidazolium hexafluorophosphate, 1-hexyl-3-methylimidazolium hexafluorophosphate), 1-butyl-1-(3,3,4,4,5,5,6,6,7,7,8,8,8-tridecafluorooctyl)imidazolium hexafluorophosphate, 1-methyl-3-(3,3,4,4,5,5,6,6,7,7,8,8-tridecafluorooctyl) imidazolium hexafluorophosphate, 1-methyl-3-octylimidazolium hexafluorophosphate, methylimidazolium tetrafluoroborates (e.g., 1,3-dimethylimidazolium tetrafluoroborate, 1-ethyl-3-methyl-imidazolium tetrafluoroborate, 1-propyl-3-methylimidazolium tetrafluoroborate, 1-butyl-3-methylimidazolium tetrafluoroborate), 1-butyl-2,3-dimethylimidazolium tetrafluoroborate, 1-hexyl-3-methylimidazolium tetrafluoroborate, 1-methyl-3-octyl-imidazolium tetrafluoroborate, methylimidazolium trifluoromethanesulfonates (e.g., 1-methyl-3-methylimidazolium trifluoromethanesulfonate, 1-ethyl-3-methylimidazolium trifluoromethanesulfonate, 1-propyl-3-methylimidazolium trifluoromethanesulfonate, 1-butyl-3-methylimidazolium trifluoromethanesulfonate), 1,2,3-trimethylimidazolium trifluoromethanesulfonate, 1-ethyl-3-methylimidazolium bis (pentafluoroethylsulfonyl)imide, 1-butyl-3-methylimidazolium bis(trifluoromethylsulfonyl)imide, 1-butyl-3-methylimidazolium methanesulfonate, tetrabutylammonium bis-trifluoromethane sulfonimidate, tetrabutylammonium methane sulfonate, tetrabutylammonium nonafluorobutane sulfonate, tetrabutylammonium heptadecafluorooctane sulfonate, tetrahexylammonium tetrafluoroborate, tetrabutylammonium trifluoromethanesulfonate, tetrabutylammoniumbenzoate, tetrabutylammonium halogenide (e.g., tetrabutylammoniumchloride, tetrabutylammoniumbromide), 1-benzyl-3-methylimidazolium tetrafluoroborate, trihexyltetradecylphosphonium hexafluorophosphate, tetrabutylphosphonium methanesulfonate, tetrabutyl-phosphonium tetrafluoroborate, tetrabutyl-phosphoniumbromide, 1-butyl-3-methylpyridinium-bis(trifluormethylsulfonyl)imide, 1-butyl-4-methylpyridinium hexafluorophosphate, 1-butyl-4-methylpyridinium tetrafluoroborate, sodium tetraphenylborate, tetrabutylammonium tetraphenylborate, sodiumtetrakis(1-imidazolyl)borate and cesium tetraphenylborate.

Alternatively or additionally, the light-emitting layer B may comprise one or more of the following compounds selected from the group consisting of an aromatic compound (e.g., benzene, biphenyl, triphenyl, triphenylene, naphthalene, anthracene, phenalene, phenanthrene, fluorene, pyrene, chrysene, perylene, azulene), an heteroaromatic compound (e.g., dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, selenophenodipyridine), and a combination of two or more thereof.

The host compound H and/or the emitter compound E may optionally also be used to transport or inject charges and thereby helps to transport charges within the light-emitting layer B.

Preferably, the light-emitting layer B concomitant to light-emission has an additional functionality selected from the group consisting of serving as an electron transport layer, a hole blocking layer, a hole transport layer, an electron blocking layer, and an exciton blocking layer.

As used herein, a solvent may be composed of one, two or more dissolving agents, typically liquids. These can in principle be organic or inorganic liquids, preferably, organic liquids.

Exemplarily, host compound H disclosed herein may be used in conjunction with a wide variety of emitter compounds E, transport layers, blocking layers, injection layers, electrodes and other layers that may be present. The materials described herein are merely non-limiting examples of materials that may be useful in combination with the compounds and components disclosed herein, and those skilled in the art are readily able to consult the literature to identify other materials that may be useful in combination herewith.

As far as present, the ratio between the host compound H and the emitter compound E may be any H:E ratio such as, e.g., in the range of from 99:1 to 1:99, preferably in the range of from 70:30 to 30:70.

In principle, the emitter compound E may be any emitter compound known in the art. The term "emitter compound" may be understood in the broadest sense as any optically active compound that is, depending on certain conditions, able to emit light when introduced into the light-emitting layer B in the organic electroluminescent device of the present invention. Accordingly, an emitter compound E may indeed be used to generate light. When subjected to an electrical current flow in a suitable strength, the emitter compound E is excited to form an exciton (i.e., an excited state such as S1(E) or T1(E) and optionally also a higher energy level such as, e.g., S2(E) etc.) The exciton may then relax into the ground energy level corresponding to the respective non-excited state S0(E) by concomitantly emitting light. The energy of the exciton may optionally also be transferred into other excited states, even of further emitter compounds and/or dyes.

Preferably, it is such that energy can be transferred from the host compound H to the emitter compound E, in particular transferred from the first excited triplet state T1(H) of the host compound H to the first excited triplet state T1(E) of the emitter compound E and/or from the first excited singlet state S1(H) of the host compound H to the first excited singlet state S1(E) of the emitter compound E.

In a preferred embodiment, the emitter compound E is a metal-free thermally activated delayed fluorescence (TADF) emitter having a first excited triplet state T1(E) energetically lower than the first excited triplet state T1(H) of the host compound H and a first excited singlet state S1(E) energetically lower than the first excited singlet state S1(H) of the host compound H.

Preferably, the energy level of the highest occupied molecule orbital HOMO(H) of host compound H is higher than that of at least one further host compounds D (herein designated as $D^1$, which can optionally also be the only further host component.).

Preferably, the host compound H has a highest occupied molecule orbital HOMO(H) having an energy $E^{HOMO}(H)$ in the range of from −5 to −6 eV.

Preferably, the at least one further host compound D ($D^1$) has a highest occupied molecule orbital HOMO(D) having an energy $E^{HOMO}(D)$, wherein $E^{HOMO}(H) > E^{HOMO}(D)$.

In a preferred embodiment, the host compound H has a highest occupied molecule orbital HOMO(H) having an energy $E^{HOMO}(H)$ in the range of from −5 to −6 eV and at least one further host compound D ($D^1$) has a highest occupied molecule orbital HOMO(D) having an energy $E^{HOMO}(D)$, wherein $E^{HOMO}(H) > E^{HOMO}(D)$.

Accordingly, for host compound $D^1$ preferably: $E^{HOMO}(H) > E^{HOMO}(D^1)$.

In a further preferred embodiment, the host compound H has a lowest unoccupied molecule orbital LUMO(H) having an energy $E^{LUMO}(H)$ and at least one further host compound D ($D^1$) has a lowest unoccupied molecule orbital LUMO(D) having an energy $E^{LUMO}(D)$, wherein $E^{LUMO}(H) > E^{LUMO}(D)$.

Accordingly, for host compound $D^1$ preferably: $E^{LUMO}(H) > E^{LUMO}(D^1)$.

More preferably:
$E^{HOMO}(H) > E^{HOMO}(D)$ and
$E^{LUMO}(H) > E^{LUMO}(D)$.

In a preferred embodiment, $E^{HOMO}(H) > E^{HOMO}(D)$ and the difference between the energy level of the highest occupied molecule orbital HOMO(E) of the emitter compound E ($E^{HOMO}(E)$) and the energy level of the highest occupied molecule orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV.

In a preferred embodiment, $E^{LUMO}(H) > E^{LUMO}(D)$ and the difference between the energy level of the lowest unoccupied molecule orbital LUMO(E) of emitter compound E ($E^{LUMO}(E)$) and the lowest unoccupied molecule orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

Preferably, the difference between the energy level of the highest occupied molecule orbital HOMO(E) of the emitter compound E ($E^{HOMO}(E)$) and the energy level of the highest occupied molecule orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV.

Additionally or alternatively, preferably, the difference between the energy level of the lowest unoccupied molecule orbital LUMO(E) of emitter compound E ($E^{LUMO}(E)$) and the lowest unoccupied molecule orbital LUMO(D) of the at least one further host compound D($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

Accordingly, for host compound $D^1$ the difference between the energy level of the lowest unoccupied molecule orbital LUMO(E) of emitter compound E ($E^{LUMO}(E)$) and the lowest unoccupied molecule orbital LUMO($D^1$) of the host compound $D^1$($E^{LUMO}(D^1)$) is preferably between −0.5 eV and 0.5 eV, more preferably between −0.3 eV and 0.3 eV, even more preferably between −0.2 eV and 0.2 eV or even between −0.1 eV and 0.1 eV.

In a highly preferred embodiment:
the host compound H has a highest occupied molecule orbital HOMO(H) having an energy $E^{HOMO}(H)$ and a lowest unoccupied molecule orbital LUMO(H) having an energy $E^{LUMO}(H)$, and the at least one further host compound D has a highest occupied molecule orbital HOMO(D) having an energy $E^{HOMO}(D)$ and a lowest unoccupied molecular orbital LUMO(D) having an energy $E^{LUMO}(D)$,
the emitter compound E has a highest occupied molecule orbital HOMO(E) having an energy $E^{HOMO}(E)$ and a lowest unoccupied molecule orbital LUMO(E) having an energy $E^{LUMO}(E)$, wherein
$E^{HOMO}(H) > E^{HOMO}(D)$ and the difference between the energy level of the highest occupied molecule orbital HOMO(E) of the emitter compound E ($E^{HOMO}(E)$) and the energy level of the highest occupied molecule orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV; and
$E^{LUMO}(H) > E^{LUMO}(D)$ and the difference between the energy level of the lowest unoccupied molecule orbital LUMO(E) of emitter compound E ($E^{LUMO}(E)$) and the lowest unoccupied molecule orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

Accordingly, for host compound $D^1$:
$E^{HOMO}(H) > E^{HOMO}(D^1)$ and the difference between the energy level of the highest occupied molecule orbital HOMO(E) of the emitter compound E ($E^{HOMO}(E)$) and the energy level of the highest occupied molecule orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV; and
$E^{LUMO}(H) > E^{LUMO}(D^1)$ and the difference between the energy level of the lowest unoccupied molecule orbital LUMO(E) of emitter compound E ($E^{LUMO}(E)$) and the lowest unoccupied molecule orbital LUMO($D^1$) of the at least one further host compound $D^1$($E^{LUMO}(D^1)$) is between −0.5 eV and 0.5 eV, more preferably between −0.3 eV and 0.3 eV, even more preferably between −0.2 eV and 0.2 eV or even between −0.1 eV and 0.1 eV.

Herein, preferably, $E^{HOMO}(H)$ is the range of from −5 to −6 eV.

Orbital and excited state energies can be determined either by means of experimental methods or calculated employing quantum-chemical methods, in particular density functional theory calculations. The energy of the highest occupied molecular orbital $E^{HOMO}$ may be determined by methods known to the person skilled in the art from cyclic voltammetry measurements with an accuracy of 0.1 eV. The energy of the lowest unoccupied molecule orbital $E^{LUMO}$ may be calculated as $E^{HOMO} + E^{gap}$, where $E^{gap}$ may be determined as follows: For host compounds, the onset of emission of a film with 10% host in PMMA may be used as $E^{gap}$, unless stated otherwise. For emitter compounds, $E^{gap}$ is determined as the energy at which the excitation and emission spectra of a film with 10% emitter in PMMA cross.

The energy of the first excited triplet state T1 may be determined from the onset of emission at low temperature, typically at 77 K. For host compounds, where the first excited singlet state and the lowest triplet state are typically energetically separated by >0.4 eV, the phosphorescence is usually visible in steady-state spectra in 2-Me-THF. The triplet energy can thus be determined as the onset of the phosphorescence spectra. For TADF emitter compounds, the energy of the first excited triplet state T1 may be determined from the onset of the delayed emission spectrum at 77 K, if not otherwise stated measured in a film of Poly(methyl methacrylate) (PMMA) with 10 weight-% of emitter. Both for host and emitter compounds, the energy of the first excited singlet state S1 may be determined from the onset of the emission spectrum, if not otherwise stated measured in a film of poly(methyl methacrylate) (PMMA) with 10 weight-% of emitter.

Particularly preferably the light-emitting layer B comprises (or (essentially) consists of):
(i) 40-89% by weight of at least one host compound H according to the present invention;
(ii) 10-30% by weight of at least one emitter compound E;
(iii) 1-50% by weight of at least one further host compound D not according to formula (I); and optionally
(iv) 0-50% by weight of a solvent, wherein
$E^{HOMO}(H) > E^{HOMO}(D)$ and the difference between the energy level of the highest occupied molecule orbital HOMO(E) of the emitter compound E ($E^{HOMO}(E)$) and the energy level of the highest occupied molecule orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H) > E^{LUMO}(D)$ and the difference between the energy level of the lowest unoccupied molecule orbital LUMO(E) of emitter compound E ($E^{LUMO}(E)$) and the lowest unoccupied molecule orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV, wherein preferably $E^{HOMO}(H)$ is the range of from −5 to −6 eV.

In a further preferred embodiment, at least one further host compound D ($D^1$) has or contains a structure of formula (XI):

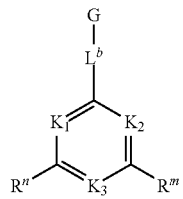
(XI)

wherein:

each of $K_1$, $K_2$ and $K_3$ is independently from another selected from the group consisting of CH, $CR^k$, and N; wherein at least one of the residues $K_1$, $K_2$ and $K_3$ is N;

wherein $R^k$ is selected from the group consisting of unsubstituted or substituted $C_1$-$C_{20}$-alkyl, $C_6$-$C_{18}$-aryl, $C_3$-$C_{17}$-heteroaryl, $C_7$-$C_{19}$-alkaryl, and —$SiR^fR^gR^h$, wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;

each of $R^n$ and $R^m$ is independently from another selected from the group consisting of hydrogen, $C_1$-$C_{20}$-alkyl, $C_6$-$C_{18}$-aryl, $C_3$-$C_{17}$-heteroaryl, $C_7$-$C_{19}$-alkaryl and —$SiR^fR^gR^h$, wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;

$L^b$ is selected from the group consisting of a single bond and optionally substituted $C_6$-$C_{18}$-arylene;

G is a group of or containing a structure of one of formulas (XII) to (XV)

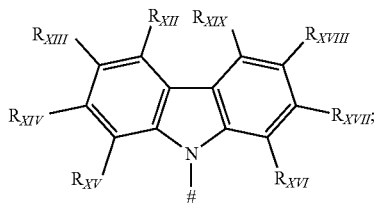
(XII)

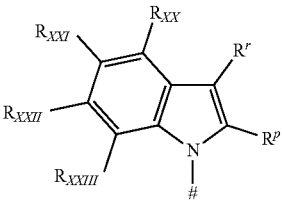
(XIII)

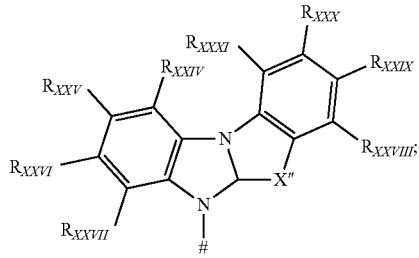
(XIV)

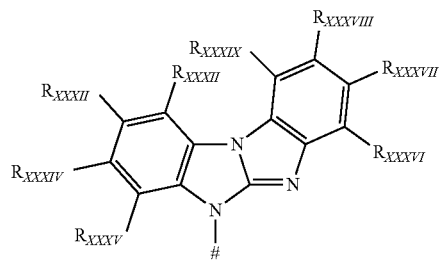
(XV)

wherein:

# is the binding site to $L^b$;

X" is selected from the group consisting of O and S;

each of $R_{XII}$, $R_{XIII}$, $R_{XIV}$, $R_{XV}$, $R_{XVI}$, $R_{XVII}$, $R_{XVIII}$, $R_{XIX}$, $R_{XX}$, $R_{XXI}$, $R_{XXII}$, $R_{XXIII}$, $R_{XXIV}$, $R_{XXV}$, $R_{XXVI}$, $R_{XXVII}$, $R_{XXVIII}$, $R_{XXIX}$, $R_{XXX}$, $R_{XXXI}$, $R_{XXXII}$, $R_{XXXIII}$, $R_{XXXIV}$, $R_{XXXV}$, $R_{XXXVI}$, $R_{XXXVII}$, $R_{XXXVIII}$ and $R_{XXXIX}$ is independently from another selected from the group consisting of hydrogen, —Cl, —Br, —I, —CN, —$CF_3$, $C_1$-$C_{20}$-alkyl, $C_6$-$C_{18}$-aryl, $C_3$-$C_{17}$-heteroaryl, $C_7$-$C_{19}$-alkaryl and —$SiR^fR^gR^h$, wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, $C_6$-$C_{18}$-aryl, —CN and —$CH_3$;

each of $R^p$ and $R^r$ is independently from another selected from the group consisting of hydrogen, $C_1$-$C_{20}$-alkyl, $C_6$-$C_{18}$-aryl, $C_3$-$C_{17}$-heteroaryl, $C_7$-$C_{19}$-alkaryl and —$SiR^fR^gR^h$ wherein $C_6$-$C_{18}$-aryl, $C_3$-$C_{17}$-heteroaryl or $C_7$-$C_{19}$-alkaryl can at each occurrence be optionally substituted by a residue selected from the group consisting of $C_1$-$C_{20}$-alkyl, $C_7$-$C_{19}$-alkaryl, $C_6$-$C_{18}$-aryl, —CN and —$CH_3$; and each of $R^f$, $R^g$, and $R^h$ is selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl and $C_3$-$C_{17}$-heteroaryl.

Just to provide examples of suitable emitter compounds E, these can have one of the following structures (EI) or (EII):

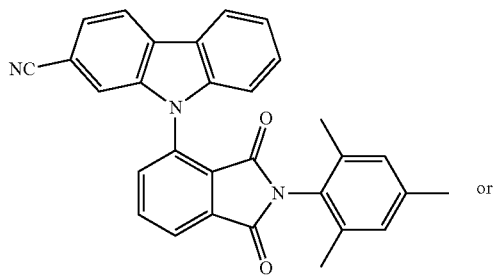

(EI)

or

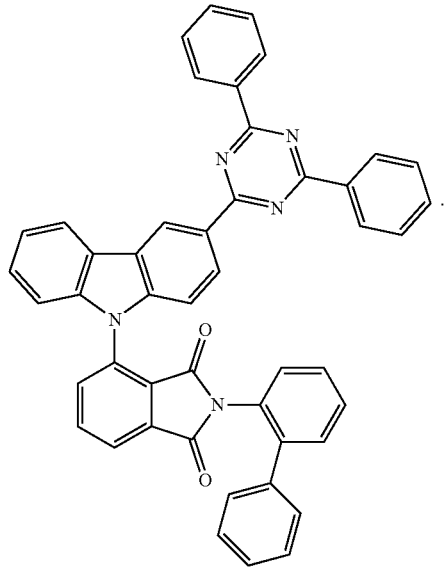

(EII)

The emitter compounds E of formulae (EI) and (EII) may be obtained by any means known in the art. The person skilled in the art will know several synthetic routes to obtain such compounds.

The emitter compound of formula (EI) may exemplarily be synthesized as follows: 3-(2-bromcarbazolyl)-N-mesitylphthalimide (1 equivalent (eq)) und CuCN (1.5 eq) may be heated in dry dimethylformamide (DMF) (2 mL per mmol arylbromide) for 24 h at 150° C. under nitrogen atmosphere. After cooling down to room temperature (RT), the brown precipitate formed may be separated by means of filtration and may be washed with DMF. By adding the double amount of water to the filtered precipitate, the crude product may be precipitated as yellow/green solid. The precipitate may be separated by means of filtration, washed with water and dissolved in ethyl acetate. The resulting solution may be dried over $MgSO_4$ and residual solvents may be removed by decreasing the pressure. The obtained product may be, exemplarily, purified by MPLC (Eluent: $CH_2Cl_2$/cyclohexane 50:50-100:0). In 10% by weight poly (methyl methacrylat) (PMMA), the emitter compound of formula (EI) has an emission maximum of 463 nm and a photoluminescence quantum yield (PLQY) of 36% with a full width at half maximum (FWHM) of 87 nm (0.48 eV).

An emitter compound such as that of formula (EII) may, in more general terms, exemplarily be synthesized as follows:

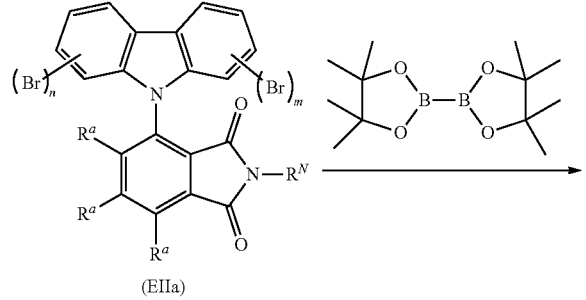

(EIIa)

(EIIb)

Herein, generally, $R^a$ may at each occurrence independently from another be hydrogen, deuterium, an alkyl group or an aryl group, in particular a hydrogen group.

Herein, $R^N$ may be a large variety of residues. In the example of emitter compound E according to formula (EII) provided here, it is wherein * indicates the binding site to the rest of the molecule. It will be noted that any numerous variations may be used instead.

(EIIa) (1.00 eq), bis(pinacolato)diboron (1.5× (n+m) eq) tris(dibenzylideneacetone)dipalladium (0.01 eq), 2-(dicyclohexylphosphino)-2',4',6'-triisopropylbiphenyl (0.04 eq) and tribasic potassium phosphate (3n+3m eq) may be stirred in dioxane for 12 to 24 h at 110° C. under nitrogen atmosphere. The intermediate product obtained may be purified by means of recrystallization. Then, the product may be processed further as follows:

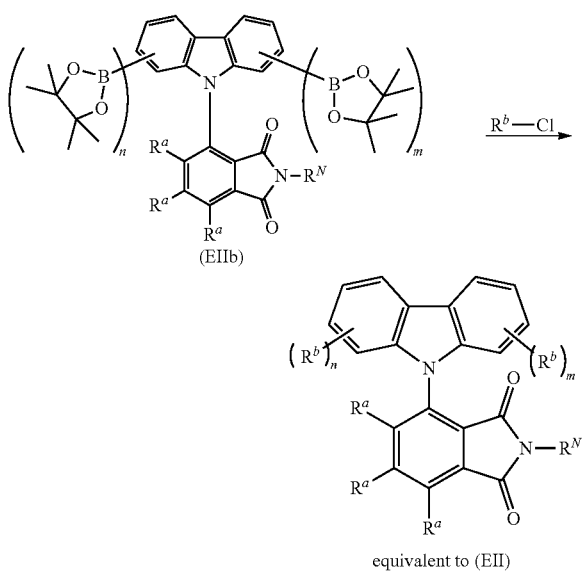

(EIIb)

equivalent to (EII)

Herein, $R^b$ may be a large variety of residues. In the example of emitter compound E according to formula (EII) provided here, it is

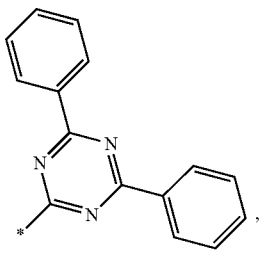 [SMILES: *c1nc(-c2ccccc2)nc(-c2ccccc2)n1]

wherein * indicates the binding site to the rest of the molecule. Further, in the example of emitter compound E according to formula (EII) provided here, n=0, m=1. It will be noted that any numerous variations may be used instead.

(EIIb) (1.00 eq), $R^b$—Cl (1.3 n+1.3 m eq), tris(dibenzylideneacetone)dipalladium (0.01 eq), 2-(dicyclohexylphosphino)-2',4',6'-triisopropylbiphenyl (0.04 eq) and tribasic potassium phosphate (2.5 n+2.5 m eq) may be stirred at 100° C. in a toluene:water (10:1) mixture for 12 to 24 h under nitrogen atmosphere. The crude product may be purified by flash chromatography and/or via recrystallization. Instead $R^b$—Cl, also $R^b$—Br or $R^b$—I may be used. In 10% by weight poly(methyl methacrylat) (PMMA), the emitter compound of formula (EII) has an emission maximum of 481 nm and a PLQY of 68% with a FWHM 92 nm (0.47 eV).

Optionally, the light-emitting layer B may comprise one or more dopants such as, e.g., those disclosed in any of paragraphs [181] to [207] of WO 2016/010402.

The person skilled in the art will notice that the light-emitting layer B will typically be incorporated in the organic electroluminescent device. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof, Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:
A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;
B) the light-emitting layer B; and
C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof,
wherein the light-emitting layer B is located between the anode layer A and the a cathode layer C.

Exemplarily, when the organic electroluminescent device is an OLED, it may optionally comprise the following layer structure:
A) an anode layer A, exemplarily comprising indium tin oxide (ITO);
HTL) a hole transport layer HTL;
B) a light-emitting layer B according to the present invention as described herein;
ETL) an electron transport layer ETL; and
C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs). Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$).

The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4′,4″-tris[phenyl(m-tolyl)amino]triphenylamine), Spiro-TAD (2,2′,7,7′-tetrakis(n,n-diphenylamino)-9,9′-spirobifluorene), DNTPD (N1,N1′-(biphenyl-4,4′-diyl)bis(N1-phenyl-N4,N4-di-m-tolylbenzene-1,4-diamine), NPB (N,N′-nis-(1-naphthalenyl)-N,N′-bis-phenyl-(1,1′-biphenyl)-4,4′-diamine), NPNPB (N,N′-diphenyl-N,N′-di-[4-(N,N-diphenyl-amino)phenyl]benzidine), MeO-TPD (N,N,N′,N′-tetrakis(4-methoxyphenyl)benzidine), HAT-CN (1,4,5,8,9,11-hexaazatriphenylen-hexacarbonitrile) and/or Spiro-NPD (N,N′-diphenyl-N,N′-bis-(1-naphthyl)-9,9′-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4′-cyclohexyliden-bis[N,N-bis(4-methylphenyl)benzenamine]), 2-TNATA (4,4′,4″-tris[2-naphthyl(phenyl)amino]triphenylamine), Spiro-TAD, DNTPD, NPB, NPNPB, MeO-TPD, HAT-CN and/or TrisPcz (9,9′-diphenyl-6-(9-phenyl-9H-carbazol-3-yl)-9H,9′H-3,3′-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), tris-Pcz, CzSi (9-(4-tert-Butylphenyl)-3,6-bis(triphenylsilyl)-9H-carbazole) and/or DCB (N,N′-dicarbazolyl-1,4-dimethylbenzene).

Adjacent to the hole transport layer (HTL), typically, the light-emitting layer B is located. This is specified in detail in the context of the present invention.

Adjacent to the light-emitting layer B an electron transport layer (ETL) may be located. Herein, any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter may also be a star-shaped heterocycle such as 1,3,5-tri(1-phenyl-1H-benzo[d]imidazol-2-yl)phenyl (TPBi). The electron transport layer (ETL) may also block holes or a hole blocking layer (HBL) is introduced. The ETL may exemplarily comprise AlQ3, TSPO1, BPyTP2 (2,7-di(2,2′-bipyridin-5-yl)triphenyle), Sif87 (dibenzo[b,d]thiophen-2-yltriphenylsilane), Sif88 (dibenzo[b,d]thiophen-2-yl) diphenylsilane), BmPyPhB (1,3-bis[3,5-di(pyridin-3-yl)phenyl]benzene) and/or BTB (4,4′-bis-[2-(4,6-diphenyl-1,3,5-triazinyl)]-1,1′-biphenyl).

The HBL may exemplarily comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide) and/or TCB/TCP (1,3,5-tris(N-carbazolyl)benzol/1,3,5-tris(carbazol)-9-yl) benzene).

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscalic silver wires.

An OLED may further, optionally, comprise a protection layer between the electron transport layer (ETL) and the cathode layer C (which may be designated as electron injection layer (EIL)). This layer may comprise lithium fluoride, cesium fluoride, silver, Liq (8-hydroxyquinolinolatolithium), $Li_2O$, $BaF_2$, MgO and/or NaF.

Optionally, also the electron transport layer (ETL) and/or a hole blocking layer (HBL) may comprise one or more host compounds H.

Optionally, an organic electroluminescent device (e.g., an OLED) may exemplarily be an essentially white organic electroluminescent device. Exemplarily such white organic electroluminescent device may comprise at least one (deep) blue emitter compound and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 µm, or more than 10 µm.

An organic electroluminescent device (e.g., an OLED) may be a small-sized (e.g., having a surface not larger than 5 mm, or even not larger than 1 mm), medium-sized (e.g., having a surface in the range of 0.5 to 20 cm), or a large-sized (e.g., having a surface larger than 20 cm). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

Accordingly, the present invention also relates to a method for generating blue, green, yellow, orange and red light.

As used herein, if not defined more specifically in a particular context, the designation of the colors of emitted and/or absorbed is as follows:
violet: wavelength range of >380-420 nm;
deep blue: wavelength range of >420-470 nm;
sky blue: wavelength range of >470-500 nm;
green: wavelength range of >500-560 nm;
yellow: wavelength range of >560-580 nm;
orange: wavelength range of >580-620 nm; red: wavelength range of >620-800 nm.

With respect to emitter compounds E, such colors refer to the emission maximum. Therefore, exemplarily, a deep blue emitter has an emission maximum in the range of from 420 to 470 nm, a sky blue emitter has an emission maximum in the range of from 470 to 500 nm, a green emitter has an emission maximum in a range of from 500 to 560 nm, a red emitter has an emission maximum in a range of from 620 to 800 nm.

A deep blue emitter may preferably have an emission maximum of below 470 nm, more preferably below 465 nm, even more preferably below 460 nm or even below 450 nm. It will typically be above 410 nm, preferably above 420 nm, more preferably above 430 nm.

Accordingly, a further aspect of the present invention relates to an OLED, which exhibits an external quantum efficiency at 1000 cd/m$^2$ of more than 5%, more preferably of more than 8%, more preferably of more than 10%, even more preferably of more than 13% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m$^2$ of more than 70 h, preferably more than 100 h, more preferably more than 200 h, even more preferably more than 300 h or even more than 400 h. Accordingly, a further aspect of the present invention relates to an OLED, whose emission exhibits a CIE$_y$ color coordinate of below 0.40, preferably below 0.30, more preferably below 0.20 or even more preferably below 0.15 or even below 0.1.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of below 0.50 eV, more preferably of below 0.46 eV, even more preferably of below 0.43 eV or even below 0.41 eV.

In the following, some exemplary structures and uses of host compounds H and devices are provided which, together with the claims, are intended to illustrate the invention further.

BRIEF DESCRIPTION OF THE FIGURE

FIG. 1 shows the luminescence intensity [cd/m$^2$] of device D1 over time [h].

EXAMPLES

General Experimental Procedures

Cyclic Voltammetry

Cyclic voltammograms of solutions having concentration of 10$^{-3}$ mol/l of the organic molecules in dichloromethane and tetrabutylammonium hexafluorophosphate as supporting electrolyte (0.1 mol/l) are recorded using a Model 601D Series Electrochemical Analyzer with work station (CH Instruments) with a scan rate of 100 mV/s. The measurements are conducted at room temperature and under nitrogen atmosphere with a three-electrode assembly (Working and counter electrodes: Pt wire, reference electrode: Pt wire) and calibrated using FeCp2/FeCp2+ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets and a m4-grid for numerical integration were used. The Turbomole program package was used for all calculations (TURBOMOLE, a development of University of Karlsruhe and Forschungszentrum Karlsruhe GmbH, 1989-2007, TURBOMOLE GmbH, since 2007).

Photophysical Measurements

Sample pretreatment: Spin-coating
Apparatus: Spin150, SPS euro.
The sample concentration is 10 mg/ml, dissolved in a suitable solvent.
Program: 1) 3 s at 400 U/min; 20 s at 1000 U/min at 1000 Upm/s. 3) 10 s at 4000 U/min at 1000 Upm/s. After coating, the films are tried at 70° C. for 1 min.

Photoluminescence spectroscopy and TCSPC (Time-correlated single-photon counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:
NanoLED 370 (wavelength: 371 nm, puls duration: 1.1 ns)
NanoLED 290 (wavelength: 294 nm, puls duration: <1 ns)
SpectraLED 310 (wavelength: 314 nm)
SpectraLED 355 (wavelength: 355 nm).
Data analysis (exponential fit) was done using the software suite DataStation and DAS6 analysis software. The fit is specified using the chi-squared-test.

Phtotoluminescence Quantum Yield Measurements

For phtotoluminescence quantum yield (PLQY) measurements an Absolute PL Quantum Yield Measurement C9920-

03G system (Hamamatsu Photonics) is used. Quantum yields and CIE coordinates were determined using the software U6039-05 version 3.6.0. Emission maxima are given in nm, quantum yields Φ in % and CIE coordinates as x,y values. PLQY was determined following the proctocol: Quality assurance: Anthracene in ethanol (known concentration) is used as reference.

Excitation wavelength: the absorption maximum of the organic molecule is determined and the molecule is excited using this wavelength Measurement: quantum yields are measured for sample of solutions or films under nitrogen atmosphere. The yield is calculated using the equation:

$$\Phi_{PL} = \frac{n_{photon},\text{ emited}}{n_{photon},\text{ absorbed}} = \frac{\int \frac{\lambda}{hc}[\text{Int}_{emitted}^{sample}(\lambda) - \text{Int}_{absorbed}^{sample}(\lambda)]d\lambda}{\int \frac{\lambda}{hc}[\text{Int}_{emitted}^{reference}(\lambda) - \text{Int}_{absorbed}^{reference}(\lambda)]d\lambda}$$

wherein nphoton denotes the photon count and Int the intensity.

Production and Characterization of Organic Electroluminescence Devices

Via vacuum-deposition methods OLED devices comprising organic molecules according to the invention can be produced. If a layer contains more than one compound the weight-percentage of one or more compounds is given in %. The total weight-percentage values amount to 100%, thus if a value is not given the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT95 to the time point, at which the measured luminance decreased to 95% of the initial luminance etc.

Accelerated lifetime measurements are performed (e.g. applying increased current densities). Exemplarily LT80 values at 500 cd/m² are determined using the following equation:

$$LT80\left(500\frac{cd}{m^2}\right) = LT80(L_0)\left(\frac{500\frac{cd}{m^2}}{L_0}\right)^{-1.6}$$

wherein $L_0$ denotes the initial luminance at the applied current density. The values correspond to the average of several pixels (typically two to eight). Figures show the data series for one OLED pixel.

Generalized Synthetic Route:

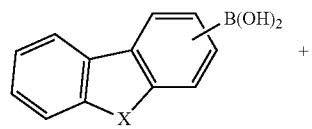

+

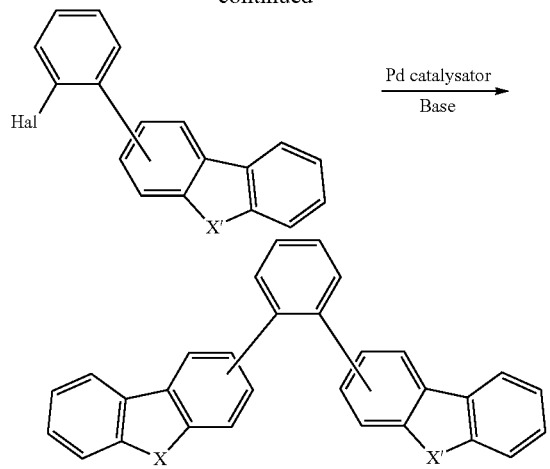

wherein Hal is halogen, preferably Br or I. Instead of a boronic acid, an equivalent borone ester, e.g. boronic acid pinacol ester, can be used.n X and X' are defined as laid out herein.

Compound 1

1.5 equivalents of 9H-carbazole-3-boronic acid, 1.0 equivalents 2-(2-bromophenyl)dibenzofurane, 2.0 equivalents of potassium carbonate and 0.01 equivalents of tetrakis (triphenylphosphine)palladium were placed in the reaction vessel, which was evacuated for 10 min, then the refilled with nitrogen and degassed toluene/water (9:1) was added. The reaction mixture was heated to 90° C. and stirred over night. After cooling to RT the reaction mixture was washed with water and brine. The organic layer was dried over MgSO4, filtered through a paper filter and the solvent was removed. The product was obtained as solid (yield 65%).

The reaction with the same conditions but with 1 equivalent of 9-phenyl-9H-3-(2-bromophenyl)-carbazole and 1.3 equivalents 2-(dibenzofuranyl)boronic acid instead of results in a yield of 8%.

Compound 1

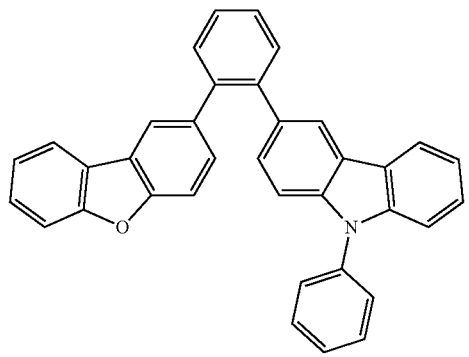

¹H-NMR (500 MHz, CDCl₃): □ 8.19 (dt, J=7.8, 1.0 Hz, 1H), 8.03 (dt, J=7.8, 0.9 Hz, 3H), 7.92-7.86 (m, 4H), 7.79-7.70 (m, 1H), 7.68-7.61 (m, 2H), 7.60-7.55 (m, 7H), 7.51 (dtt, J=6.8, 3.0, 1.5 Hz, 8H), 7.45 (ddd, J=8.2, 7.0, 1.2 Hz, 1H), 7.40 (ddd, J=7.9, 2.1, 1.2 Hz, 2H), 7.38-7.31 (m, 5H), 7.27 (t, J=1.9 Hz, 2H), 7.14 (td, J=7.5, 0.9 Hz, 4H), 6.99 (ddd, J=8.4, 7.1, 1.2 Hz, 4H), 6.81 (d, J=8.2 Hz, 3H).

Compound 2

Compound 2 was prepared analogously to compound 1 with 2-(2-bromophenyl)dibenzothiophene replacing 2-(2-bromophenyl)dibenzofurane as educt.

Compound 2

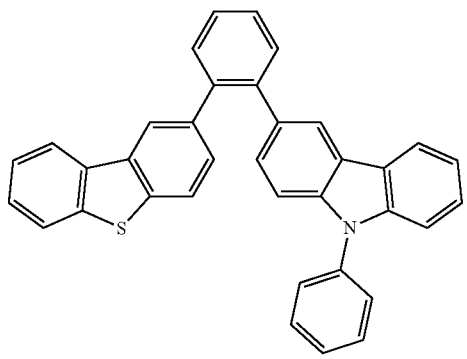

$^1$H-NMR (500 MHz, CDCl$_3$): ☐ 8.20 (dt, J=7.7, 0.9 Hz, 1H), 8.11 (d, J=1.6 Hz, 2H), 8.04 (tt, J=7.8, 1.0 Hz, 5H), 7.96-7.90 (m, 2H), 7.86 (d, J=8.2 Hz, 2H), 7.79-7.70 (m, 1H), 7.65-7.57 (m, 6H), 7.56-7.48 (m, 8H), 7.46 (td, J=7.3, 1.1 Hz, 3H), 7.42 (ddd, J=7.8, 2.1, 1.1 Hz, 2H), 7.38 (dd, J=8.3, 1.8 Hz, 2H), 7.34 (ddd, J=8.0, 7.0, 1.1 Hz, 1H), 7.31 (t, J=1.9 Hz, 2H), 7.18-7.12 (m, 4H), 7.00 (ddd, J=8.3, 7.1, 1.2 Hz, 3H), 6.80 (d, J=8.2 Hz, 3H).

Compound 3

2.2 equivalents 2-(dibenzofuranyl)boronic acid, 1.0 equivalent 1,2-diiodobenzene, 2.0 equivalents of potassium carbonate and 0.01 equivalents of tetrakis(triphenylphosphine)palladium were placed in the reaction vessel, which was evacuated for 10 min, then the refilled with nitrogen and degassed toluene/water (9:1) was added. The reaction mixture was heated to 90° C. and stirred over night. After cooling to RT the reaction mixture was washed with water and brine. The organic layer was dried over MgSO4, filtered through a paper filter and the solvent was removed. The product was obtained as solid (yield 46%).

Compound 3

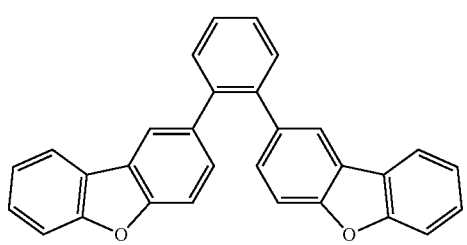

$^1$H-NMR (500 MHz, CDCl$_3$): ☐ 7.90 (d, J=1.8 Hz, 1H), 7.87 (dd, J=7.5, 1.2 Hz, 1H), 7.60 (dd, J=5.7, 3.4 Hz, 1H), 7.56 (d, J=8.2 Hz, 1H), 7.53 (dd, J=5.7, 3.4 Hz, 1H), 7.46 (ddd, J=8.4, 7.3, 1.3 Hz, 1H), 7.36-7.30 (m, 2H), 7.19 (dd, J=8.5, 1.8 Hz, 1H).

Compound 4 was prepared analogously to compound 3 with 2-(dibenzothiophenyl)boronic acid replacing 2-(dibenzofuranyl)boronic acid as educt.

Compound 4

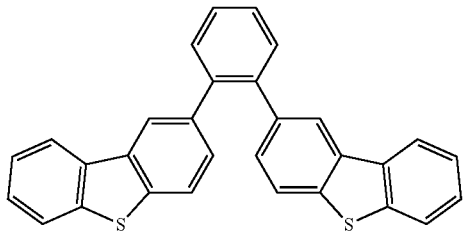

$^1$H-NMR (500 MHz, CDCl$_3$): ☐☐8.16 (dd, J=1.7, 0.5 Hz, 1H), 8.08-8.04 (m, 1H), 7.88-7.82 (m, 1H), 7.64 (dd, J=5.7, 3.4 Hz, 1H), 7.60 (dd, J=8.4, 0.6 Hz, 1H), 7.55 (dd, J=5.7, 3.4 Hz, 1H), 7.45 (pd, J=7.2, 1.5 Hz, 2H), 7.18 (dd, J=8.3, 1.7 Hz, 1H).

Compound 5 was prepared analogously to compound 1 with 2-(dibenzothiophenyl)boronic acid and 2-(2-bromophenyl)dibenzofurane as educts.

Compound 5

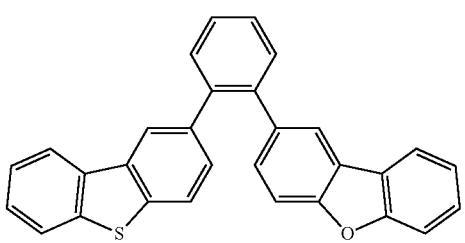

$^1$H-NMR (500 MHz, CDCl$_3$): ☐ 8.49 (dd, J=1.8, 0.6 Hz, 1H), 8.34-8.29 (m, 1H), 8.14 (dd, J=1.7, 0.6 Hz, 2H), 8.09-8.03 (m, 2H), 8.00 (dd, J=8.2, 0.6 Hz, 1H), 7.96-7.91 (m, 3H), 7.90-7.82 (m, 6H), 7.65-7.59 (m, 7H), 7.58-7.51 (m, 9H), 7.49-7.41 (m, 7H), 7.38-7.30 (m, 5H), 7.19 (ddd, J=13.9, 8.4, 1.8 Hz, 5H).

Device Examples

Compound 1 was tested in an OLED device (Device D1) with the layer structure given in the following Table 1.

TABLE 1

| Design of Device D1 | | |
| --- | --- | --- |
| Layer | thickness | D1 |
| 9 | 100 nm | Al |
| 8 | 2 nm | Liq |
| 7 | 40 nm | NBPhen |
| 6 | 20 nm | 1 (80%):EII (20%) |
| 5 | 10 nm | TCTA |
| 4 | 70 nm | NPB |
| 3 | 5 nm | HAT-CN |
| 2 | 50 nm | PEDOT:PSS |
| 1 | 130 nm | ITO |
| substrate | | glass |

The emission maximum was determined at 491 nm, the turn on voltage at 3.1 V. The LT80 at 500 cd/m$^2$ was determined at 449 h.

For comparison, a comparable layer structure was tested in OLED device C1 with the standard host mCBP with the layer structure given in the following Table 2.

TABLE 2

| Layer | Thickness | C1 |
|---|---|---|
| 9 | 100 nm | Al |
| 8 | 2 nm | Liq |
| 7 | 40 nm | NBPhen |
| 6 | 20 nm | mCBP (80%):EII (20%) |
| 5 | 10 nm | TCTA |
| 4 | 80 nm | NPB |
| 1 | 130 nm | ITO |
| substrate | | Glass |

The emission maximum was determined at 480 nm, the turn on voltage at 2.2 V. The LT80 at 500 cd/m² was calculated at 40 h.

The invention claimed is:

1. An organic electroluminescent device comprising a light-emitting layer B containing at least one host compound H of formula (I):

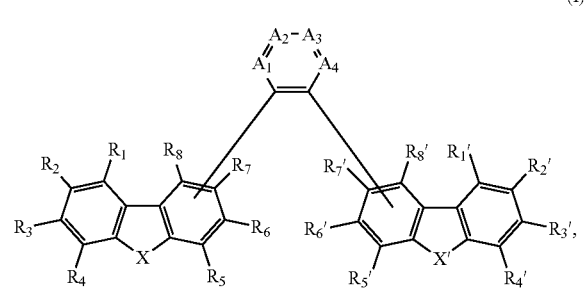

(I)

wherein:
each of $A_1$, $A_2$, $A_3$, and $A_4$ is independently from another selected from the group consisting of CH and $CR^a$;
one of $R_5$, $R_6$, $R_7$, and $R_8$ and one of $R'_5$, $R'_6$, $R'_7$, and $R'_8$ are each a binding site to the optionally substituted $C_4$-$C_6$-(hetero)arylene residue comprising the residues $A_1$, $A_2$, $A_3$, and $A_4$, and each of the remaining residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$, and $R'_8$ are;
X is O or S;
X' is $NR^e$, O, or S; and
each of $R^a$ and $R^e$ is selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl, and $C_3$-$C_{17}$-heteroaryl.

2. The organic electroluminescent device of claim 1, wherein the organic electroluminescent device is a device selected from the group consisting of an organic light emitting diode, a light emitting electrochemical cell, and a light-emitting transistor.

3. The organic electroluminescent device of claim 1, wherein at least two of $A_1$, $A_2$, $A_3$, and $A_4$ are each CH.

4. The organic electroluminescent device of claim 1, wherein $A_1$, $A_2$, $A_3$, and $A_4$ are each CH.

5. The organic electroluminescent device of claim 1, wherein $A_1$, $A_2$, $A_3$, and $A_4$ are each CH and all of the residues $R_1$, $R_2$, $R_3$, $R_4$, $R_5$, $R_6$, $R_7$, $R_8$, $R'_1$, $R'_2$, $R'_3$, $R'_4$, $R'_5$, $R'_6$, $R'_7$, and $R'_8$ which are not the binding site to the optionally substituted $C_4$-$C_6$-(hetero)arylene residue comprising the residues $A_1$, $A_2$, $A_3$, and $A_4$ are each hydrogen.

6. The organic electroluminescent device of claim 1, wherein X' is $NR^e$ and $R^e$ is selected from the group consisting of an unsubstituted or substituted residue selected from the group consisting of phenyl, pyridyl, methyl, ethyl, biphenyl, and terphenyl.

7. The organic electroluminescent device of claim 1, wherein the host compound H has a structure according to one of the following formulae (II)-(IV):

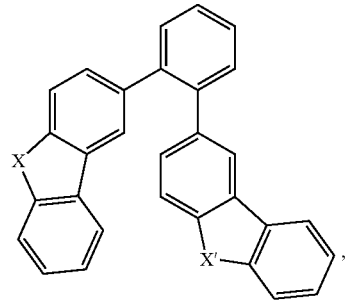

(II)

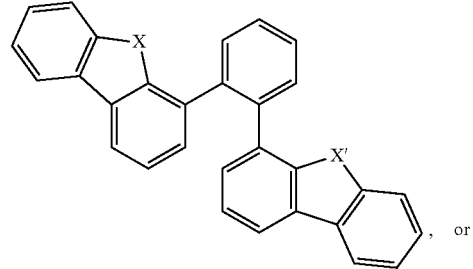

(III), or

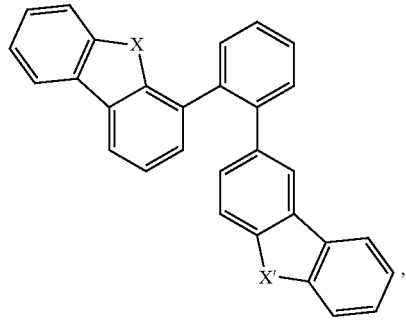

(IV)

wherein X and X' are defined as in claim 1.

8. The organic electroluminescent device of claim 1, wherein the host compound H has a structure of the following formula (V):

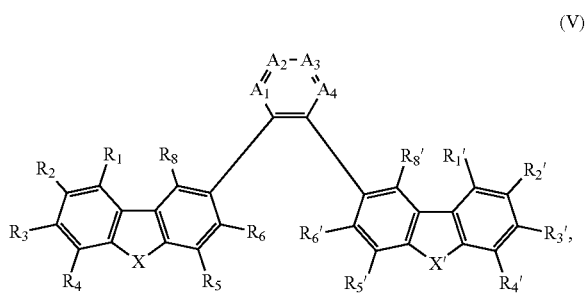

(V)

wherein the residues $A_1$, $A_2$, $A_3$, $A_4$, $R_1$, $R_2$, $R_3$, $R_4$, $R_5$, $R_6$, $R_8$, $R'_1$, $R'_2$, $R'_3$, $R'_4$, $R'_5$, $R'_6$, $R'_8$, X, and X' are defined as in claim 1.

9. The organic electroluminescent device of claim 1, wherein the host compound H has a structure according to one of the following formulae (VI)-(X):

(VI)
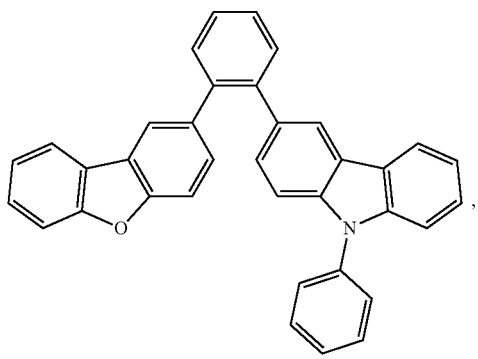

(VII)
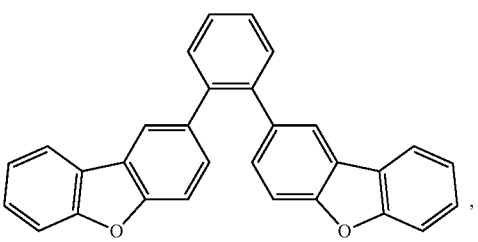

(VIII)
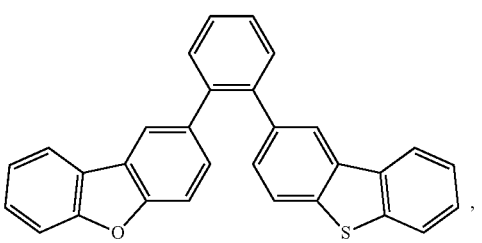

(IX)
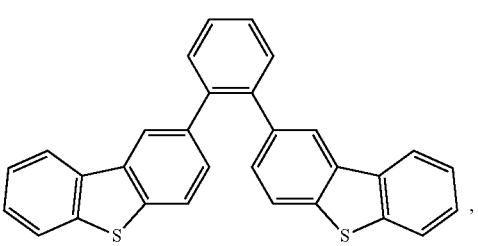

, or (X)
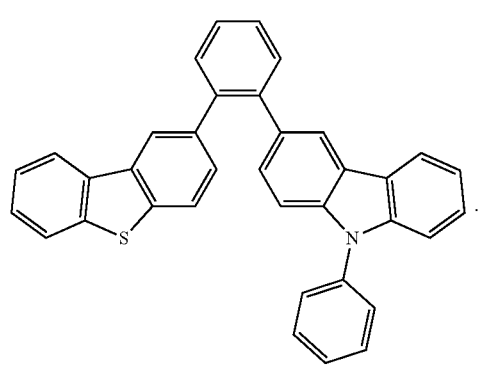

10. The organic electroluminescent device of claim 1, wherein the light-emitting layer B comprises:

(i) 5-99% by weight, of at least one host compound H of claim 1;
(ii) 1-50% by weight of at least one emitter compound E; and optionally
(iii) 0-94% by weight of at least one further host compound D not according to formula (I); and optionally
(iv) 0-94% by weight of a solvent.

11. The organic electroluminescent device of claim 10, wherein the host compound H has a highest occupied molecule orbital HOMO(H) having an energy $E^{HOMO}(H)$ in the range of from −5 to −6 eV and at least one further host compound D has a highest occupied molecule orbital HOMO(D) having an energy $E^{HOMO}(D)$, wherein $E^{HOMO}(H) > E^{HOMO}(D)$.

12. The organic electroluminescent device of claim 10, wherein the host compound H has a lowest unoccupied molecule orbital LUMO(H) having an energy $E^{LUMO}(H)$ and at least one further host compound D has a lowest unoccupied molecule orbital LUMO(D) having an energy $E^{LUMO}(D)$, wherein $E^{LUMO}(H) > E^{LUMO}(D)$.

13. The organic electroluminescent device of claim 10, wherein:
the host compound H has a highest occupied molecule orbital HOMO(H) having an energy $E^{HOMO}(H)$ and a lowest unoccupied molecule orbital LUMO(H) having an energy $E^{LUMO}(H)$, and the at least one further host compound D has a highest occupied molecule orbital HOMO(D) having an energy $E^{HOMO}(D)$ and a lowest unoccupied molecule orbital LUMO(D) having an energy $E^{LUMO}(D)$,
the emitter compound E has a highest occupied molecule orbital HOMO(E) having an energy $E^{HOMO}(E)$ and a lowest unoccupied molecule orbital LUMO(E) having an energy $E^{LUMO}(E)$, wherein $E^{HOMO}(H) > E^{HOMO}(D)$ and the difference between the energy level of the highest occupied molecule orbital HOMO(E) of the emitter compound E ($E^{HOMO}(E)$) and the energy level of the highest occupied molecule orbital HOMO(H) of the host compound H ($E^{HOMO}(H)$) is between −0.5 eV and 0.5 eV; and
$E^{LUMO}(H) > E^{LUMO}(D)$ and the difference between the energy level of the lowest unoccupied molecule orbital LUMO(E) of emitter compound E ($E^{LUMO}(E)$) and the lowest unoccupied molecule orbital LUMO(D) of the at least one further host compound D ($E^{LUMO}(D)$) is between −0.5 eV and 0.5 eV.

14. The organic electroluminescent device of claim 10, wherein at least one further host compound D has or contains a structure of formula (XI):

(XI)
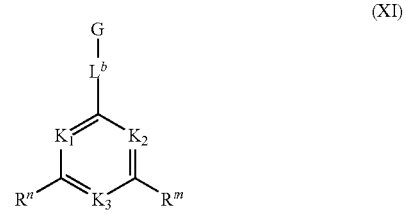

wherein:
each of $K_1$, $K_2$, and $K_3$ is independently from another selected from the group consisting of CH, $CR^k$, and N; wherein at least one of the residues $K_1$, $K_2$, and $K_3$ is N;

wherein $R^k$ is selected from the group consisting of unsubstituted or substituted $C_1$-$C_{20}$-alkyl, $C_6$-$C_{18}$-aryl, $C_3$-$C_{17}$-heteroaryl, $C_7$-$C_{19}$-alkaryl, and —SiR$^f$R$^g$R$^h$, wherein $C_6$-$C_{18}$-aryl, $C_3$-$C_{17}$-heteroaryl, or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;

each of R″ and R‴ is independently from another selected from the group consisting of hydrogen, $C_1$-$C_{20}$-alkyl, $C_6$-$C_{18}$-aryl, $C_3$-$C_{17}$-heteroaryl, $C_1$-$C_{19}$-alkaryl, and —SiR$^f$R$^g$R$^h$, wherein $C_6$-$C_{18}$-aryl, $C_3$-$C_{17}$-heteroaryl, or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;

$L^b$ is selected from the group consisting of a single bond and optionally substituted $C_6$-$C_{18}$-arylene;

G is a group of or containing a structure of one of formulas (XII) to (XV)

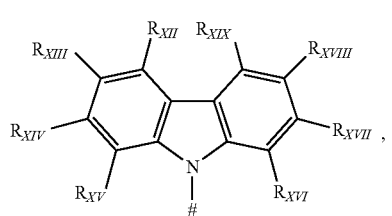

(XII)

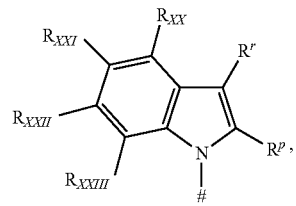

(XIII)

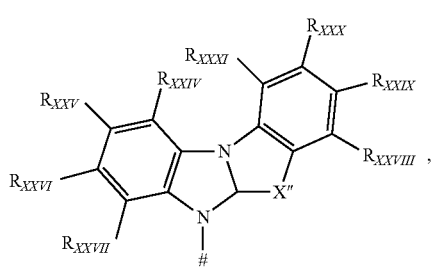

(XIV)

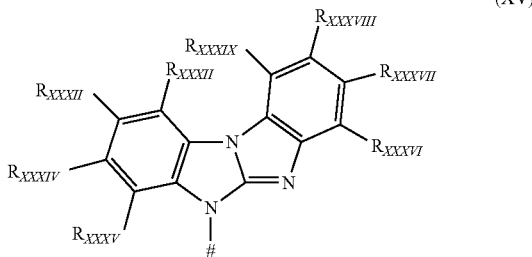

(XV)

wherein:
# is the binding site to $L^b$;
X″ is selected from the group consisting of O and S;
each of $R_{XII}$, $R_{XIII}$, $R_{XIV}$, $R_{XV}$, $R_{XVI}$, $R_{XVII}$, $R_{XVIII}$, $R_{XIX}$, $R_{XX}$, $R_{XXI}$, $R_{XXII}$, $R_{XXIII}$, $R_{XXIV}$, $R_{XXV}$, $R_{XXVI}$, $R_{XXVII}$, $R_{XXVIII}$, $R_{XXIX}$, $R_{XXX}$, $R_{XXXI}$, $R_{XXXII}$, $R_{XXXIII}$, $R_{XXXIV}$, $R_{XXXV}$, $R_{XXXVI}$, $R_{XXXVII}$, $R_{XXXVIII}$, and $R_{XXXIX}$ is independently from another selected from the group consisting of hydrogen, —Cl, —Br, —I, —CN, —CF$_3$, $C_1$-$C_{20}$-alkyl, $C_6$-$C_{18}$-aryl, $C_3$-$C_{17}$-heteroaryl, $C_7$-$C_{19}$-alkaryl, and —SiR$^f$R$^g$R$^h$, wherein $C_6$-$C_{18}$-aryl, $C_3$-$C_{17}$-heteroaryl, or $C_7$-$C_{19}$-alkaryl can at each occurrence be optionally substituted by a residue selected from the group consisting of $C_1$-$C_{20}$-alkyl, $C_7$-$C_{19}$-alkaryl, $C_6$-$C_{18}$-aryl, —CN, and —CH$_3$;

each of $R^p$ and $R^r$ is independently from another selected from the group consisting of hydrogen, $C_1$-$C_{20}$-alkyl, $C_6$-$C_{18}$-aryl, $C_3$-$C_{17}$-heteroaryl, $C_7$-$C_{19}$-alkaryl, and —SiR$^f$R$^g$R$^h$ wherein $C_6$-$C_{18}$-aryl, $C_3$-$C_{17}$-heteroaryl, or $C_7$-$C_{19}$-alkaryl can at each occurrence be optionally substituted by a residue selected from the group consisting of $C_1$-$C_{20}$-alkyl, $C_7$-$C_{19}$-alkaryl, $C_6$-$C_{18}$-aryl, —CN, and —CH$_3$; and each of $R^f$, $R^g$, and $R^h$ is selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl, and $C_3$-$C_{17}$-heteroaryl.

15. The organic electroluminescent device of claim 1, wherein the organic electroluminescent device comprises at least the following layers:
A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;
B) the light-emitting layer B; and
C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof,
wherein the light-emitting layer B is located between the anode layer A and the a cathode layer C.

16. A method for generating light of a desired wavelength range, comprising the steps of:
(i) providing an organic electroluminescent device of claim 1; and
(ii) applying an electrical current to the organic electroluminescent device.

* * * * *